United States Patent
Smith

(10) Patent No.: US 8,975,913 B2
(45) Date of Patent: Mar. 10, 2015

(54) METHOD AND CIRCUIT STRUCTURE FOR SUPPRESSING SINGLE EVENT TRANSIENTS OR GLITCHES IN DIGITAL ELECTRONIC CIRCUITS

(71) Applicant: Nelson Mandela Metropolitan University, Port Elizabeth (ZA)

(72) Inventor: Farouk Smith, Port Elizabeth (ZA)

(73) Assignee: Nelson Mandela Metropolitan University, Summerstrand, Port Elizabeth (ZA)

( * ) Notice: Subject to any disclaimer, the term of this patent is extended or adjusted under 35 U.S.C. 154(b) by 0 days.

(21) Appl. No.: 14/353,215

(22) PCT Filed: Oct. 19, 2012

(86) PCT No.: PCT/IB2012/055738
§ 371 (c)(1),
(2) Date: Apr. 21, 2014

(87) PCT Pub. No.: WO2013/057707
PCT Pub. Date: Apr. 25, 2013

(65) Prior Publication Data
US 2014/0247068 A1    Sep. 4, 2014

(30) Foreign Application Priority Data

Oct. 21, 2011    (ZA) ................................. 2011/07718
Oct. 21, 2011    (ZA) ................................. 2011/07719
Jan. 27, 2012    (ZA) ................................. 2012/00683

(51) Int. Cl.
*H03K 19/003*    (2006.01)
*H03K 19/00*    (2006.01)
(Continued)

(52) U.S. Cl.
CPC ...... *H03K 19/00346* (2013.01); *H03K 19/0033* (2013.01); *H03K 19/0008* (2013.01); *H03K 19/0075* (2013.01); *G01R 31/31816* (2013.01)
USPC .............................. 326/12; 326/10; 327/108

(58) Field of Classification Search
None
See application file for complete search history.

(56) References Cited

U.S. PATENT DOCUMENTS 6,320,406 B1 *    11/2001    Morgan et al. .................. 326/14
6,703,858 B2    3/2004    Knowles
(Continued)

OTHER PUBLICATIONS

International Search Report; Australian Patent Office; International Application No. PCT/IB2012/055738; dated Feb. 25, 2013.
(Continued)

*Primary Examiner* — Crystal L Hammond
(74) *Attorney, Agent, or Firm* — Faegre Baker Daniels LLP

(57) ABSTRACT

A circuit structure (200) for suppressing single event transients (SETs) or glitches in digital electronic circuits is provided. The circuit structure includes a first input (100) which receives an output of a digital electronic circuit (A), a second input (100') which receives a redundant or duplicated output of the digital electronic circuit (A'), and two sub-circuits (102, 106) that each receive the inputs and have one output. One of the sub-circuits is insensitive to a change in the value of one of its inputs when the inputs are in a first logic state and the other sub-circuit is insensitive to a change in the value of one of the inputs when the inputs are in a second, inverted logic state. The sub-circuit outputs are input into a two-input multiplexer (202) which has its output (204) connected to its selection port (SEL), and the sub-circuits are arranged so that the sub-circuit which is insensitive to a change in the value of one of its inputs is selected whenever the output of the multiplexer changes. The multiplexer output (204) is provided as a final output in which SETs and glitches have been suppressed.

14 Claims, 15 Drawing Sheets

(51) Int. Cl.
*H03K 19/007* (2006.01)
*G01R 31/3181* (2006.01)

(56) References Cited

U.S. PATENT DOCUMENTS

| | | | |
|---|---|---|---|
| 7,208,984 B1* | 4/2007 | Petrofsky | 327/108 |
| 7,386,826 B1 | 6/2008 | Keller et al. | |
| 7,411,411 B1* | 8/2008 | Fulkerson | 326/9 |
| 7,592,934 B1* | 9/2009 | Bourstein et al. | 341/100 |
| 7,804,431 B1* | 9/2010 | Bourstein et al. | 341/100 |
| 2008/0094117 A1* | 4/2008 | Stoler et al. | 327/162 |
| 2009/0204933 A1 | 8/2009 | Rezgui | |
| 2010/0106448 A1 | 4/2010 | Satterfield et al. | |

OTHER PUBLICATIONS

Written Opinion; Australian Patent Office; International Application No. PCT/IB2012/055738; dated Feb. 25, 2013.

Teifel, J. : "Self-Voting Dual-Modular-Redundancy Circuits for Single-Event-Transient Mitigation", IEEE Transactions on Nuclear Science, vol. 55, No. 6, Dec. 2008, pp. 3435-3439.

\* cited by examiner

METHOD AND CIRCUIT STRUCTURE FOR SUPPRESSING SINGLE EVENT TRANSIENTS OR GLITCHES IN DIGITAL ELECTRONIC CIRCUITS

RELATED APPLICATIONS

This application is a national phase filing of International Application No. PCT/IB2012/055738, filed Oct. 19, 2012, which claims priority to South African Application No. 2011/07718, filed Oct. 21, 2011; South African Application No. 2011/07719, filed Oct. 21, 2011; and South African Application No. 2012/00683, filed Jan. 27, 2012, the entire contents of all are incorporated by reference.

FIELD OF THE INVENTION

The invention relates to a method and circuit structure for suppressing single event transients or glitches in digital electronic circuits. The invention finds particular but by no means exclusive application in mitigating single event transients (SETs) in combinational circuits which form part of programmable sequential electronic circuits, such as volatile or non-volatile Field Programmable Gate Arrays (FPGAs) and Application Specific Integrated Circuits (ASICs).

BACKGROUND TO THE INVENTION

There is increasing interest in the use of field programmable gate arrays (FPGAs) for many space-based computing operations. Although FPGAs are generally slower than their Application Specific Integrated Circuit (ASIC) counterparts, cannot handle as complex a design and draw more power, they do offer several important advantages. These include a shorter time to market, ability to re-program in the field to correct errors and lower engineering costs. Since this is ideal for spacecraft applications, the space community has actively evaluated radiation effects for most new FPGAs being introduced. Unfortunately, while FPGAs offer several benefits for space-based electronics, they are generally sensitive to Single Event Effects (SEEs).

SEEs are caused by ionization as a consequence of the impact of a heavy ion (cosmic ray) or proton. The ionization induces a current pulse in a p-n junction. Single Event Effects include those effects which permanently damage circuitry, such as Single Event Latch-Up (SEL), Single Event Gate Rupture (SEGR), or Single Event Burnout (SEB), as well as "soft errors" referred to as Single Event Transients (SETs), which do not permanently damage circuitry.

SETs are caused by charged particles depositing charge on circuit elements through ionization. These deposited charges cause elevated local voltage levels in the circuit elements, which can non-destructively change the state of a bi-stable element. In a combinational logic element, the charge will leak away (typically over several hundreds of picoseconds) and the element will return to the correct state. However, when synchronous logic is disturbed by an SET on a clock edge, the temporarily incorrect logic value is latched into the register. This incorrect value can then propagate though the rest of the circuit. SETs that are latched into a register are called Single Event Upsets (SEUs).

In a satellite computer, for example, a bit-flip caused by an SEU could randomly change critical data, randomly change program data, or randomly change a register value. The changes can cause the software to perform unintended commands and thus cause the software to "crash".

SEUs in an FPGA may affect the user design flip-flops, the FPGA configuration memory, as well as any hidden FPGA registers, latches, or internal state. Configuration memory upsets are especially problematic because such upsets affect both the state and operation of the design. Configuration upsets may perturb the routing resources and logic functions in a way that changes the operation of the circuit. The effects of single event upsets in the device configuration memory are not limited to modifications in the memory elements, but they may also produce modifications in the interconnections inside Configurable Logic Blocks (CLB) and among different CLBs, thus giving rise to totally different circuits from those intended.

Flash and Antifuse FPGAs have configuration memories that are insensitive to SETs, and any SET present in the user logic will be temporary. However, in FPGAs with volatile memories, in particular in SRAM based FPGAs, the major contributor of errors caused by SETs is due to configuration memory errors. Configuration memory errors in SRAM based FPGAs do not dissipate, but persist until a power reset loads new configuration memory on the FPGA or a scheduled configuration memory reset occurs. SEUs can become Single Event Functional Interrupts (SEFI) when they upset control circuits, such as state machines, placing the device into an undefined state, a test mode, or a halt, which would then need a reset or a power cycle to recover.

From the above it is apparent that some kind of single event upset mitigation scheme is crucial for the successful deployment of FPGAs and even ASICs for space-based applications. Single event upset mitigation can also be important for safety-critical terrestrial applications.

Double Modular Redundancy (DMR) SEU mitigation solutions rely on duplication of the combinational circuit and a comparison of the outputs of the duplicated circuits. Most DMR solutions, however, are only generally able to detect SEUs but not mask or correct them.

The most common mitigation scheme for correcting SEU errors in sequential circuits in orbit is Triple Modular Redundancy (TMR) plus scrubbing. TMR is a spatial redundancy technique that compares three signal values by means of a voting circuit, where the output is equal to the two inputs that agree. Any single event upsets will be removed through scrubbing and the bad state will either be masked or fixed by the triple modular redundancy (depending on the implementation). TMR is often exploited for hardening digital logic against single event upsets in safety-critical applications. As an instance, TMR is often exploited to design fault-tolerant memory elements to be employed in sequential digital logic. The main disadvantage of TMR is the excessive area overhead. The hardened design, with triplication of the combinational circuit and additional voting circuitry, can have between 4 and 7 times more area and power consumption than the original circuit, which limits its usage to reliability-critical applications.

Radiation tolerant FPGAs for space and military applications are available, but these tend to be orders of magnitude more expensive than their off-the-shelf counterparts. Furthermore, while radiation tolerant FPGAs or non-volatile FPGAs or ASICS are capable of masking the effects of single event upsets in the configuration memory, triple modular redundancy is generally still required in the user logic circuitry for critical applications.

In the applicant's own PCT application number PCT/IB2011/000640, a method and circuit for mitigating SEUs is presented which relies on double modular redundancy and a voter circuit between each pair of outputs, where the voter circuit is able to indicate the presence of an SEU if the two outputs are not identical. The voter outputs are all compared by a multiple input voter circuit and, if any one or more of the voter outputs indicates the presence of an SEU, the state memory latch elements (such as flip-flops) are all disabled until the presence of the single event upset has disappeared. In this way, the circuit "freezes" for the duration of the single event upset. While this method is effective in mitigating SEUs, the voters require a significant amount of additional circuitry and complexity, double modular redundancy is still required, and a small additional delay is introduced during the time in which the circuit is "frozen". Furthermore, configuration memory errors are identified by detecting that the circuit has remained frozen for more than a predetermined time period and then reconfiguring the configuration memory. This wait time introduces much longer time delays in the case of configuration memory errors.

It would be advantageous to have a means for suppressing single event transients or glitches in digital electronic circuits that does not have the circuit area and power requirements of triple modular redundancy (or even of double modular redundancy), does not require expensive radiation tolerant circuitry, results in less time delay, requires less circuitry than the applicant's previous circuit and method, but which nevertheless offers substantial immunity against the errors caused by glitches and single event transients.

SUMMARY OF THE INVENTION

In accordance with the invention there is provided a circuit structure for suppressing single event transients (SETs) or glitches in digital electronic circuits, comprising:
- a first input which receives an output of a digital electronic circuit;
- a second input which receives a redundant or duplicated output of the digital electronic circuit;
- two sub-circuits that each receive the first and second inputs and each have one output;
- wherein the output of one of the sub-circuits is insensitive to a change in the value of one of the inputs when the inputs are in a first logic state, and wherein the output of the other of the sub-circuits is insensitive to a change in the value of one of the inputs when the inputs are in a second, inverted logic state;
- a two-input multiplexer which receives the outputs of the two sub-circuits as the multiplexer's inputs and selects one of the multiplexer's inputs as its output;
- wherein the selected multiplexer input is determined by the logic value of the output of the multiplexer and the two sub-circuits are arranged so that the output of the sub-circuit which is insensitive to a change in the value of one of the inputs is selected whenever the output of the multiplexer changes;
- so that the output of the multiplexer is always insensitive to an SET or glitch in the digital electronic circuit that may result in a temporary change in the logic value of either the first input or the second input;
- the output of the multiplexer being provided as a final output of the digital electronic circuit in which SETs and glitches have been suppressed.

Further features of the invention provide for one sub-circuit to be an "AND" or a "NOR" gate which is insensitive to a change in the value of one of its inputs when both inputs are at logic 0, and for the other sub-circuit to be an "OR" or a "NAND" gate which is insensitive to a change in the value of one of its inputs when both inputs are at logic 1.

Still further features of the invention provide for the output of the multiplexer to be connected to a selection port of the multiplexer so that the selected multiplexer input is determined by whether the output of the multiplexer is at logic 0 or logic 1.

In a first aspect of the invention, the redundant or duplicated output of the digital electronic circuit is a duplicated circuit output provided by passing the digital circuit output through a delay element to produce a delayed duplicated circuit output.

Further features according to the first aspect of the invention provide for the delay element to include one or more circuit elements which introduce a timing delay without inverting the digital electronic circuit output, the output of the multiplexer thereby being insensitive to an SET or glitch that may temporarily change the logic value of the either the circuit output or the delayed duplicated circuit output for a time period that is shorter than the timing delay introduced by the delay element.

In a second aspect of the invention, the redundant or duplicated output is a redundant output provided by a second identical redundant electronic circuit. Further features according to the second aspect of the invention provide for the circuit structure to include a sensing circuit which compares the first input to the output of the multiplexer and compares the second input to the output of the multiplexer so as to determine in which of the two circuits an SET or glitch has occurred and, upon detection of an SET or glitch, disconnects the digital electronic circuit in which the SET or glitch occurred from the two sub-circuits, so that the output of the multiplexer follows only the input connected to the electronic circuit which did not experience an SET or glitch, until a power reset or memory reconfiguration has occurred.

In a further aspect of the invention, the circuit structure includes a third input which receives a redundant output provided by a third identical redundant electronic circuit, wherein the two sub-circuits each receive all three inputs, and wherein the output of one of the sub-circuits is insensitive to a simultaneous change in the value of two of the three inputs when the three inputs are in a first logic state, and wherein the output of the other of the sub-circuits is insensitive to a simultaneous change in the value of two of the three inputs when the three inputs are in a second, inverted logic state, the output of the multiplexer thereby being insensitive to Multiple Bit Upsets (MBUs) that may be caused by simultaneous SETs or glitches in two of the three digital electronic circuits.

The digital electronic circuit may be a combinational electronic circuit that includes next-state logic, wherein the final output is to be latched into a state memory latch element, and the combinational electronic circuit may be part of a sequential circuit. In some embodiments, the sequential circuit may be selected from the group consisting of non-volatile Field Programmable Gate Arrays (FPGAs), Application Specific Integrated Circuits (ASICs) or volatile FPGAs.

In a yet further aspect of the invention, the output of the multiplexer may be connected to a state memory latch element, and the entire suppression circuit structure and state memory latch element may be triplicated and the output of each of the three state memory latch elements to be input into a majority voter which always selects as its output the value of the majority of its inputs, the circuit structure itself thereby being hardened against SETs or glitches that may occur in the suppression circuit structure itself.

The invention extends to a method of suppressing single event transients (SETs) or glitches in digital electronic circuits, comprising:

taking an output of a digital electronic circuit as a first input;

taking a redundant or duplicated output of the digital electronic circuit as a second input;

inputting the first and second inputs into two sub-circuits that each receive the first and second inputs and each have one output;

wherein the output of one of the sub-circuits is insensitive to a change in the value of one of the inputs when the inputs are in a first logic state, and wherein the output of the other of the sub-circuits is insensitive to a change in the value of one of the inputs when the inputs are in a second, inverted logic state;

inputting the two sub-circuit outputs into a two-input multiplexer which receives the outputs of the two sub-circuits and selects one of the multiplexer's inputs as its output;

wherein the selected multiplexer input is determined by the logic value of the output of the multiplexer and the two sub-circuits are arranged so that the output of the sub-circuit which is insensitive to a change in the value of one of the inputs is selected whenever the output of the multiplexer changes;

so that the output of the multiplexer is always insensitive to an SET or glitch in the digital electronic circuit that may result in a temporary change in the logic value of either the first input or the second input; and providing the output of the multiplexer as a final output of the digital electronic circuit in which SETs and glitches have been suppressed.

The invention further extends to a circuit structure for suppressing single event transients (SETs) or glitches in digital electronic circuits, comprising:

a first input which receives an output of a digital electronic circuit;

a second input which receives a redundant output redundant output provided by a second identical redundant electronic circuit;

an SET/glitch suppression sub-circuit which is capable of suppressing glitches or SETs that result in a temporary change in the logic value of either the first input or the second input and which provides an output in which SETs and glitches have been suppressed; and a sensing circuit which compares the first input to the output of the SET/glitch suppression sub-circuit and compares the second input to the output of the SET/glitch suppression sub-circuit so as to determine in which of the two digital electronic circuits an SET or glitch has occurred and, upon detection of an SET or glitch, disconnects the input connected to the electronic circuit in which the SET or glitch occurred from the two sub-circuits, so that the output of the multiplexer follows only the input connected to the electronic circuit which did not experience an SET or glitch, until a power reset or memory reconfiguration has occurred.

Further features according to this aspect of the invention provide for the sensing circuit to include a pair of XOR gates which compares the first input to the output of the SET/glitch suppression sub-circuit and compares the second input to the output of the SET/glitch suppression sub-circuit to determine in which of the two digital electronic circuits an SET or glitch has occurred, and a pair of multiplexers which are interposed between the digital electronic circuit outputs and the first and second inputs and arranged so that, when an SET or glitch is detected by the sensing circuit, the output of the digital electronic circuit in which the SET or glitch was detected is disconnected from the SET/glitch suppression sub-circuit until a power reset or memory reconfiguration has occurred. The SET/glitch suppression sub-circuit may be a guard gate.

BRIEF DESCRIPTION OF THE DRAWINGS

The invention will now be described, by way of example only with reference to the accompanying representations in which.

LIST OF ABBREVIATIONS

The following is a list of the acronyms and abbreviations used in this specification and their meanings:
ASIC: Application-Specific Integrated Circuit
BUF: Tri-state Buffer
DMR: Double Modular Redundancy
EDIF: Electronic Design Interchange Format
FPGA: Field Programmable Gate Array
MBU: Multiple Bit Upset
SEB: Single Event Burnout
SEE: Single Event Effect
SEFI: Single Event Functional Interrupts
SEGR: Single Event Gate Rupture
SEL Single Event Latch-Up
SEU: Single Event Upset
SRAM: Static Random Access Memory
TMR: Triple Modular Redundancy
VHDL: Very High speed integrated circuit Hardware Description Language

DETAILED DESCRIPTION WITH REFERENCE TO THE DRAWINGS

For a single event transient (SET) to result in a single event upset (SEU) in a digital electronic circuit such as a sequential circuit, three conditions have to be satisfied: (1) an active path must exist between the afflicted node and the output of the circuit; (2) the pulse must be wide enough to avoid inertial delay filtration through subsequent gates and survive electrical attenuation along the active path; and (3) the pulse should arrive within the setup and hold time of a latch element, such as a flip-flop, to be captured and cause a soft fault.

A sequential circuit operates by transitioning from one state to the next, generating different output signals. The part of a sequential circuit that is responsible for determining the next state is called the next-state-logic circuit, which is a combinational circuit. Based on the current state of the system (the state memory flip-flops) and any input signals, the next-state-logic combinational circuit will determine the next state of the system. The combinational circuit takes as its inputs the current system state as well as any input signals. The outputs of the combinational circuit are used to change the contents of the state memory flop flops. The circuit changes state when the contents of the state memory change, and this happens at the active edge of every clock cycle.

Although this description will make particular reference to sequential circuits, it will be understood that the circuit structures and methods disclosed herein could be equally used in other kinds of digital electronic circuits.

Sensitive and Insensitive Gates

With respect to a test vector, a "sensitive" input of a gate is an input which, if changed, causes the output of the gate to change. An input can be sensitive or insensitive depending on the type of gate and the current value of the other inputs.

Figure 1A:
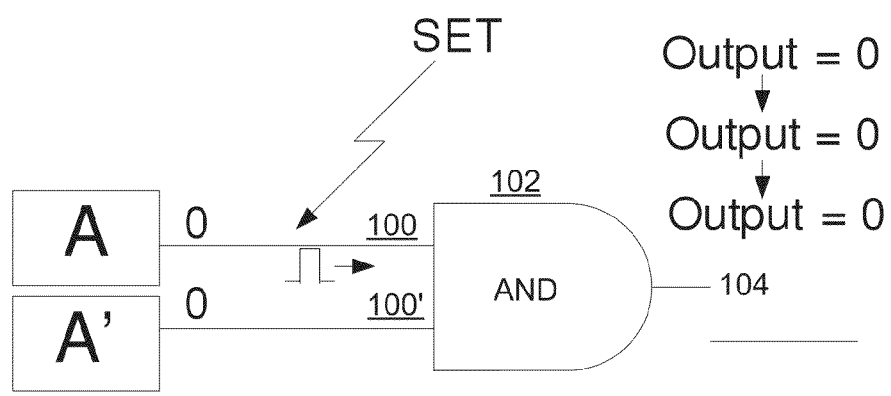
FIG. 1A is a circuit diagram of an AND gate with two inputs and one output where the inputs are at logic 0.

FIG. 1A shows a digital electronic circuit, in this case a combinational circuit (A), and an identical redundant combinational circuit at A'. The combinational circuits each have one output (100, 100') which form two inputs for an AND gate (102). The AND gate has a single output (104). In normal circumstances, the outputs (100, 100') of the combinational circuits (A, A') will be identical, since the two circuits are identical. However, it may occur that a Single Event Transient (SET) or glitch occurs in one of the combinational circuits which propagates to the AND gate. If the current value of both A and A' is logic 0, and an SET occurs which temporarily causes one of the two inputs (in this case, 100) to become logic 1, the output (104) of the AND gate will remain logic 0, since "1 AND 0"="0". Therefore, the output (104) is insensitive to a change in one of its inputs when both inputs are at zero. Hence, with both inputs to the AND gate at logic 0, the AND gate is insensitive to SETs. However, the opposite is true if both inputs to the AND gate are at logic 1.

Figure 1B:
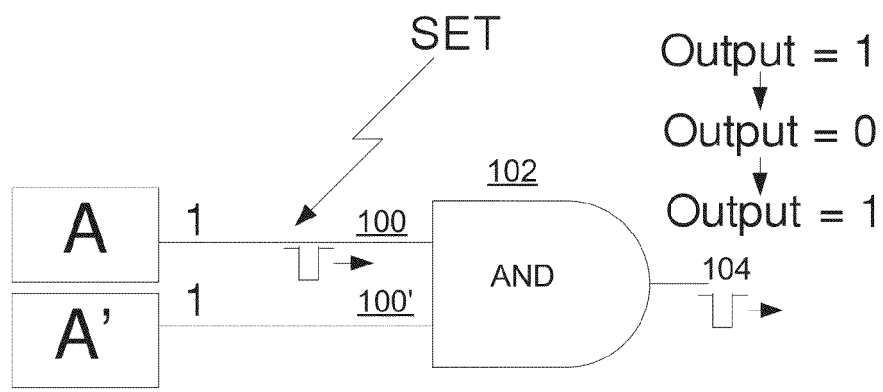
FIG. 1B is a circuit diagram of an AND gate with two inputs and one output where the inputs are at logic 1.

Consider FIG. 1B, which is identical to FIG. 1A except that both inputs to the AND gate are now at logic 1. With both inputs at logic 1, an SET or glitch at either of the two inputs will cause a change in the output. The output, which should be at logic 1, will be temporarily inverted due to the SET. Hence, with both inputs to the AND gate at logic 1, the AND gate is sensitive to SETs. If this AND gate was the next state logic in a sequential circuit, and the inverted output occurs simultaneously with the active edge of the clock, the SET will be latched, causing an SEU.

Figure 2A:
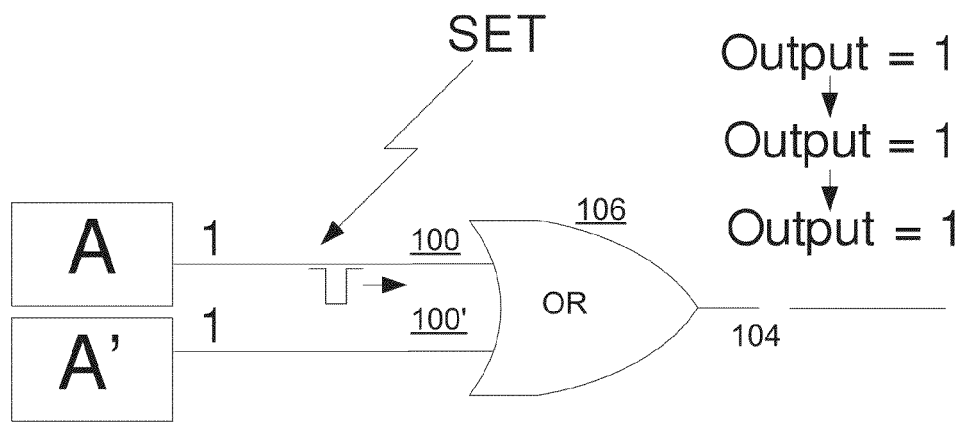
FIG. 2A is a circuit diagram of an OR gate with two inputs and one output where the inputs are at logic 1.
Figure 2B:
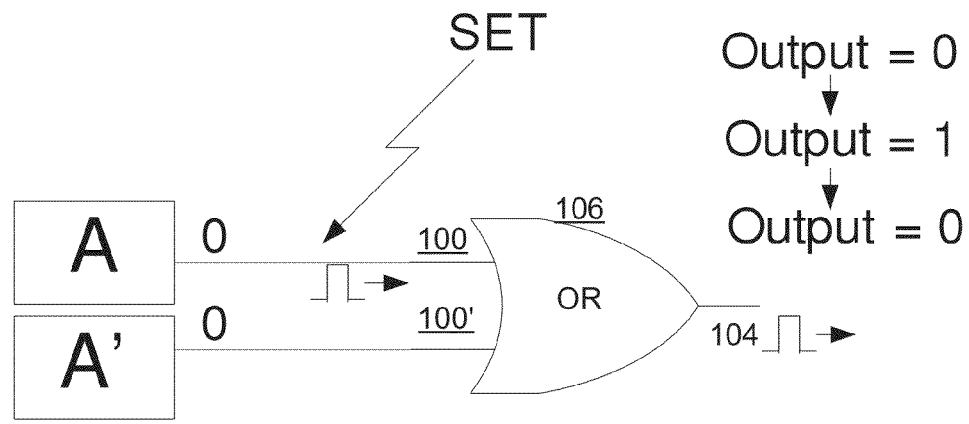
FIG. 2B is a circuit diagram of an OR gate with two inputs and one output where the inputs are at logic 0.

Now consider FIG. 2A, which is similar to FIG. 1B except that the AND gate has been replaced with an OR gate (106). With both inputs to the OR gate at logic 1, an SET at any one of the two inputs (100, 100') will not cause a change in the output (104), since "1 OR 0"="1". Hence with both inputs to the OR gate (106) at logic 1, the OR gate is insensitive to SETs. Conversely, consider FIG. 2B, which is identical to FIG. 2A except that both inputs to the OR gate are now at logic 0. With both inputs at logic 0, an SET at either of the two inputs will cause a change in the output. Hence with both inputs to the OR gate at logic 0, the OR gate is sensitive to SETs. As with FIG. 1B, if the inverted output occurs simultaneously with the active edge of the clock, the SET will be latched, causing an SEU.

Therefore, the AND gate of FIG. 1A is insensitive to SETs when the combinational circuit outputs are at logic 0, and the OR gate of FIG. 2A is insensitive to SETs when the combinational circuit outputs are at logic 1. Thus, an SET or glitch (i.e. a bit flip) which occurs on one circuit line immediately after both combinational circuits are at logic 0 will be dissipated by the AND gate of FIG. 1A, and an SET which occurs on one circuit line immediately after both combinational circuits are at logic 1 will be dissipated by the OR gate of FIG. 2A.

Figure 3:
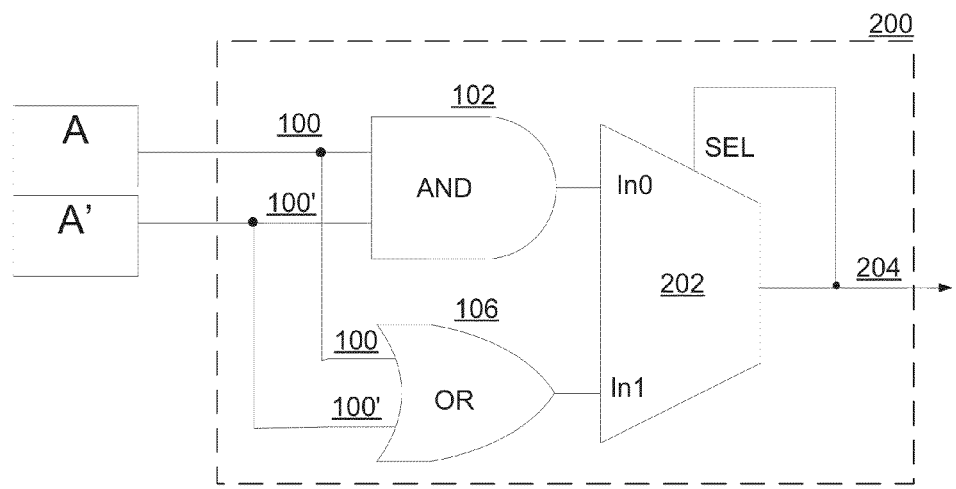
FIG. 3 is a circuit diagram of a circuit structure capable of mitigating a single event transient (SET) according to an embodiment of the invention.

An SET Suppression Circuit Using Double Modular Redundancy for Non-Volatile FPGAs According to the Invention FIG. 3 is a circuit diagram of a circuit structure (200) for suppressing single event transients (SETs) or glitches in digital electronic circuits according to the invention. The circuit of FIG. 3 uses a two-input multiplexer (202) to select the AND gate (102) when the two inputs (100, 100') are at logic 0, and to select the OR gate when the two inputs (100, 100') are at logic 1. This circuit is therefore capable of mitigating the effects of an SET or glitch irrespective of the particular outputs. The operation of the circuit structure (200) will now be explained.

Prior to the combinational circuits (A, A') being switched on, both inputs (100, 100') are at logic 0. Both the outputs of the AND gate and the OR gate will therefore be at logic 0. Since both inputs (In0, In1) to the multiplexer are at logic 0, its output (204) will be logic 0. With the output of the multiplexer connected to its own selection line (SEL), it will select either In0 or In1, depending on the value of the output. In this case, with the output at logic 0, it will select In0, which is connected to the output of the AND gate. After the circuit is switched on, assuming that the inputs (100, 100') remain at logic 0, an SET which occurs on either of the inputs (100, 100') will be suppressed by the AND gate and the output (204) will remain unchanged. The output (204) is connected to a state memory latch element such as a flip flop (not shown).

At some later time, the combinational circuits (A, A') transition and the inputs (100, 100') transition to logic 1. In this case, the output of both the AND gate as well as the OR gate will transition to logic 1. Since the AND gate output was initially passed through to the multiplexer output (204), the multiplexer output becomes logic 1, and thus its select line (SEL) becomes logic 1, resulting in In1 (the output of the OR gate) now being selected. Should an SET now occur on either of the inputs (100, 100'), the SET will be suppressed by the OR gate and the output (204) will remain unchanged. The output (204) of the circuit structure (200) of FIG. 3 will therefore always be insensitive to an SET that occurs in one of the combinational circuits (A, A').

An SET Suppression Circuit using Double Modular Redundancy for Volatile FPGAs

The circuit of FIG. 3 is effective in suppressing SETs in Antifuse and Flash based FPGAs, which have configuration memories that are resistant to SETs. However, in volatile FPGAs such as SRAM FPGAs the configuration memory is not resistant to SETs, and although the circuit of FIG. 3 will suppress an SET the first time it happens by correctly choosing the circuit in which the SET has not occurred, it can do so only the first time if the error occurred in the configuration memory of the circuit, as such errors cause the configuration memory to remain corrupted until it is repowered. This can be explained by referring to the detailed timing simulation of FIG. 4.

Figure 4:
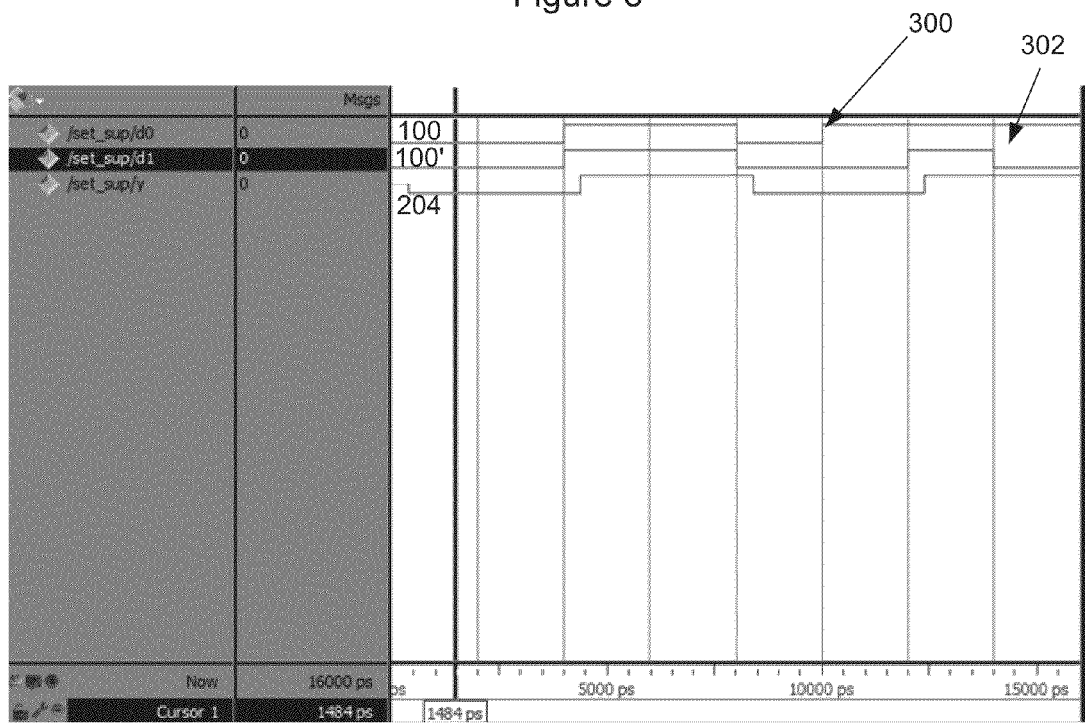
FIG. 4 is a detailed timing simulation of the inputs and output of the circuit of FIG. 3 in which simulated SETs have been introduced.

FIG. 4 shows a detailed timing simulation of the two inputs (100, 100') and the output (204) of the circuit (200) of FIG. 3. The timing simulation includes all gate delays in the circuits, so as to indicate the actual output which a real world circuit would produce. Between time zero and 10,000 ps, both inputs (100, 100') are identical and the output follows the input, with a small delay resulting from gate propagation delays. At 10,000 ps, an SET (300) occurs in one of the inputs (100), resulting in a permanent configuration memory SEU. The circuit of FIG. 3 correctly suppresses the change and the output (204) follows the other circuit (100'). Hence we know that the error occurred in the circuit A. However, since a configuration memory error is permanent, the input (100) remains at logic 1 for the duration of the clock cycle. Some time later, at 12,000 ps, the uncorrupted circuit input (100') transitions to logic 1, which means that the output of the two circuits are identical and the circuit of FIG. 3 changes its state to select the OR gate (106). At this point, with the OR gate selected, the dominant value of the circuit of FIG. 3 is logic 1, and it will resist any change to that value. At 14,000 ps, the uncorrupted circuit input (100') changes its state back to logic 0, and this change is incorrectly suppressed by the circuit of FIG. 3. Hence, for FPGAs with volatile configuration memories, such as SRAM FPGAs, as soon as the error is first detected and suppressed by the circuit of FIG. 3, the corrupted circuit must be disconnected until the next power reset, so that the SET suppressor only selects the correct circuit.

Figure 5:
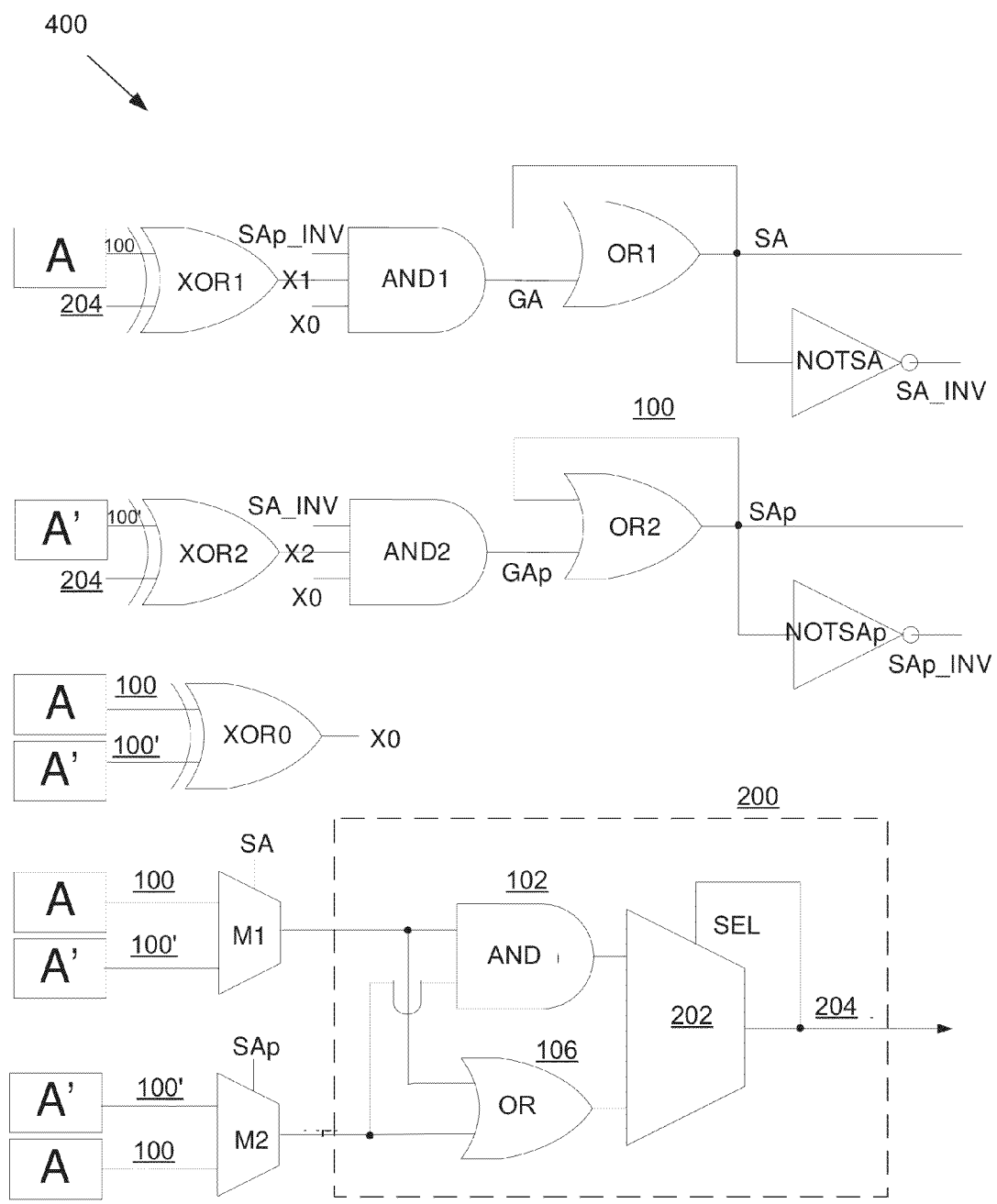
FIG. 5 is a circuit capable of mitigating SEUs caused by SETs in volatile FPGAs according to a further embodiment of the invention.

FIG. 5 shows a circuit structure (400) capable of mitigating SEUs caused by SETs in volatile FPGAs according to the invention. The portion (200) indicated in dotted lines is an SET suppression circuit identical to the circuit structure of FIG. 3 and functions in the manner previously described. However, the remainder of the circuit forms a sensing circuit which compares the combinational circuit output (100) to the output of the multiplexer (204) (which is also the output to be latched into the state memory latch element, and will therefore be referred to as the latch output hereafter) and compares the redundant combinational circuit output (100') to the latch output (204) so as to determine in which of the two combinational circuits an SET has occurred. Upon detection of an SET, the sensing circuit disconnects the output of the combinational circuit (A, A') in which the SET occurred from the two sub-circuits, so that the circuit output follows only the output of the combinational circuit which did not experience an SET, until a power reset or memory reconfiguration has occurred. The operation of the sensing circuit portion of the circuit structure (400) will now be explained in detail.

The sensing circuit includes a pair of comparators (XOR1, XOR2), which are XOR gates. XOR1 compares the combinational circuit output (100) to the multiplexer output (204). The output of XOR1 will be logic 1 if its two inputs (100, 204) are different, and logic 0 if its two inputs are the same. Similarly, the output of XOR2 will be logic 1 if its two inputs (100', 204) are different, and logic 0 if its two inputs are the same. However, due to the time delay between the combinational circuit outputs (100, 100') and the latch output (204), there will always be a glitch during which time the combinational circuit outputs (100, 100') and the latch output (204) are not the same, even though no SET has occurred. Suppose the outputs 100 and 100' change values from logic 0 to logic 1. The output (100) is immediately available at the input of XOR1, however, the latch output (204) will only change its value after three component delays, resulting in the glitch at the output of XOR1. Therefore, XOR1 will temporarily signal that an SET has occurred, which is of course not the case. The same applies for XOR2 which, in this example, will also erroneously signal that an SET has occurred.

To remove the glitch, a third comparator (XOR0) is provided which compares the combinational circuit outputs (100, 100') with each other. The output (X0) of this comparator is then input into a pair of AND gates (AND1, AND2), which also have the output of XOR1 and XOR2 as their inputs. Since X0 will only be logic 1 when the combinational circuit outputs (100, 100') are different from each other, the outputs of AND1 and AND2 (GA and GAp) will have the glitch removed.

Consider the situation where both combinational circuit outputs (100, 100') are at logic 0 and an SET occurs in the configuration memory of A which permanently (i.e. until the next memory reconfiguration) inverts output 100 to logic 1. The SEU suppression circuit (200) will suppress the SET as previously explained so that the output (204) will remain at logic 0. The output of XOR1 will become logic 1 since its inputs are now different, whereas the output of XOR2 will remain logic 0 since the SET only occurred in A and not in A'.

Since 100 and 100' are different, the output of XOR0 (X0) will become logic 1. The output of AND1 will therefore also become logic 1 whereas the output of AND2 will remain at logic 0.

Since the configuration memory error is permanent, the circuit (A) in which the SET occurred needs to be disconnected until the next power reset. To achieve this, two OR gates are provided (OR1, OR2), that have their outputs (SA, SAp) connected to one of their inputs. Once one of the inputs of OR1 or OR2 transition to logic 1, the output (SA, SAp) will remain at logic 1 until power is reset, because of the feedback loops provided. Therefore, as soon as an SET occurs in one of the combinational circuits (A, A'), one of the sensing circuit outputs (SA, SAp) will become a permanent logic 1.

To ensure that the output (100, 100') of the combinational circuit (A, A') in which the error occurred is permanently disconnected from the input of the SET suppression circuit (200), a pair of multiplexers (M1, M2) are interposed between the combinational circuit outputs (100, 100') and the SET suppression circuit. The sensing circuit outputs (SA, SAp) are connected to the selection port of each multiplexers (M1, M2) respectively. At start-up and during normal operation in the absence of an SET, SA and SAp remain at logic 0 and the multiplexers select 100 and 100' respectively as their outputs. However, when one of the sensing circuit outputs (SA, SAp) transitions to logic 1, the corresponding multiplexer (M1, M2) switches its output to the other input, so that both multiplexers (M1, M2) now select the same combinational circuit output—either 100 or 100'. For example, if an SET occurs in circuit A, SA will transition to logic 1, and M1 will select 100' as its output. Both multiplexers (M1, M2) now have their outputs connected to circuit A', and circuit A has been permanently disconnected from the SEU suppression circuit (200).

At the output of the sensing circuit, the inverse of SA and SAp (namely SA_INV and SAp_INV) are also cross connected and input into AND2 and AND1 respectively. This ensures that once the incorrect circuit output (in the preceding example, output 100) has been disconnected, the other circuit output (100') remains selected by the multiplexers (M1, M2). In this case, once output SA has transitioned to logic 1, SA_INV will transition to logic 0 and the output of AND2 will be forced to remain at logic 0 irrespective of what happens with signals X0 or X2. The same analysis applies for an error in A'.

Figure 6A:
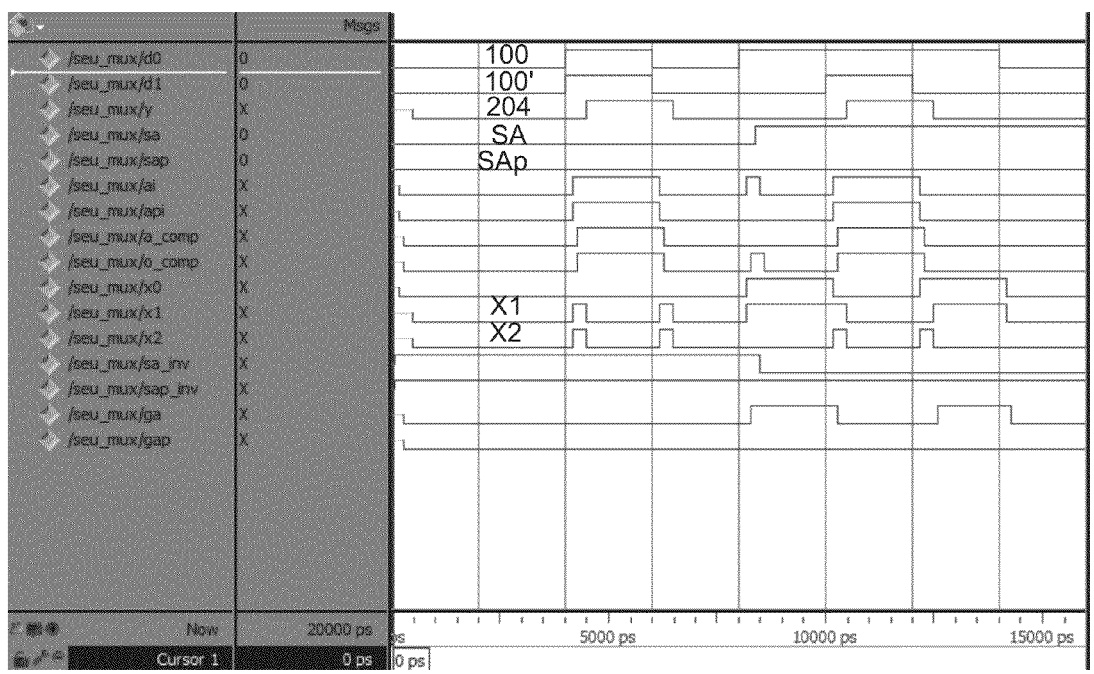
FIGS. 6A-6C are detailed timing simulations of various points of the circuit of FIG. 5.
Figure 6B:
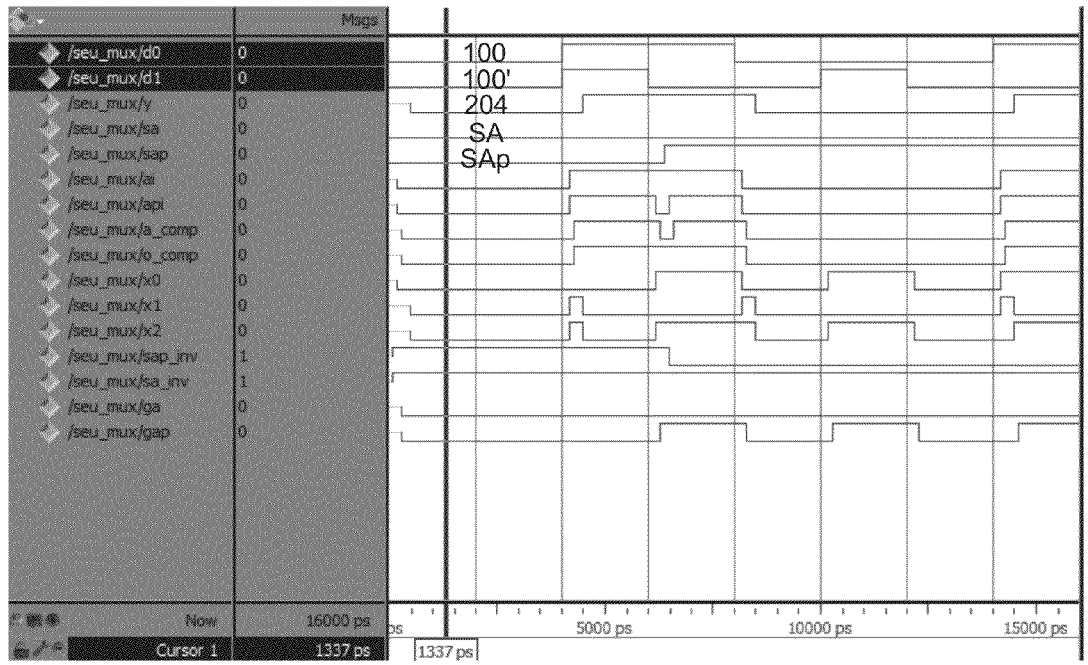
Figure 6C:
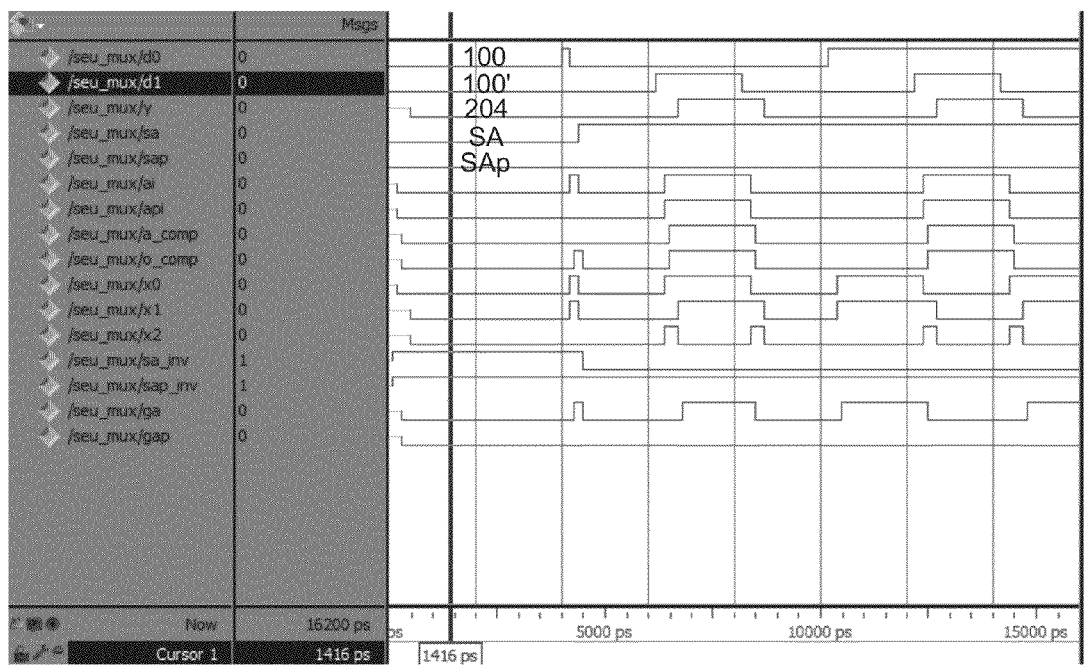

FIGS. 6A to 6C show detailed timing simulations of various points of the circuit of FIG. 5. In FIG. 6A, a permanent configuration memory SET is introduced in the circuit output 100 (circuit A) at 8,000 ps, causing signal SA to transition to logic 1 and remain at logic 1 permanently. With SA at logic 1, signal SAp remains at logic 0, thus the multiplexer M1 selects circuit A' (output 100') and M2 also selects A'. The output (204) then follows circuit A' permanently until the circuit is reset. The glitches can be clearly seen at the X1 and X2 but these do not affect the remainder of the circuit as previously explained.

In FIG. 6B, an error is introduced in the output 100' (circuit A') at 6,000 ps. The opposite happens to the illustration of FIG. 6A. SA remains at logic 0, SAp goes to logic 1, which means that output 100 (circuit A) is always passed to the output (204) and A' is permanently disconnected.

In FIG. 6C, an SET is introduced into the user logic at 4,000 ps. Because this SET is not a configuration memory SET, it is temporary and not permanent. However, the circuit of FIG. 5 does not distinguish between errors in the user logic and errors in the SRAM configuration memory. Hence, it will permanently disconnect circuit A (output 100) from the output, and only select A' (100'). This is not a problem, since the configuration memory will be reset at regular intervals to prevent the accumulation of errors, a technique called configuration memory scrubbing.

It will be appreciated that while FIGS. 3 and 5 illustrate a double modular redundant combinational circuit with only one output (100, 100'), the circuit will be repeated for each pair of corresponding outputs in the case of a double modular redundant combinational circuit with multiple outputs.

Figure 7:
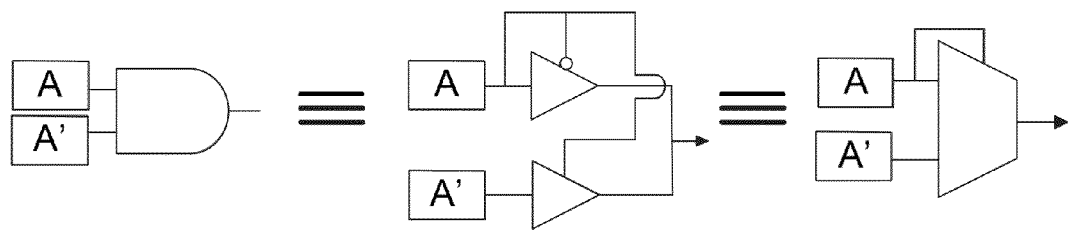
FIG. 7 is a circuit diagram showing the AND gate of FIGS. 1A and 1B and two other circuits that are logically equivalent to the AND gate.
Figure 8:
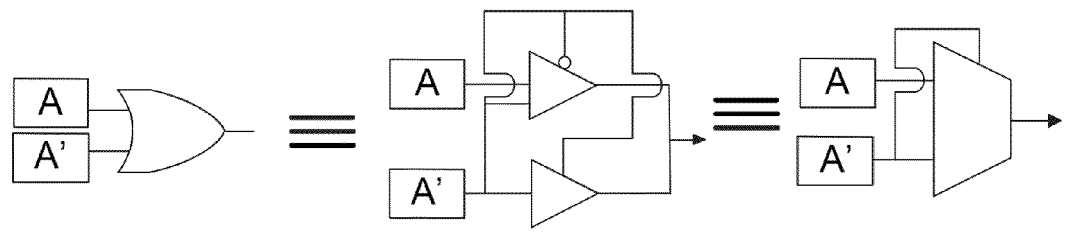
FIG. 8 is a circuit diagram showing the OR gate of FIGS. 2A and 2B and two other circuits that are logically equivalent to the OR gate.

AND and OR gates are not the only gates which are insensitive to changes in one of their inputs at differing input levels, and gates other than AND and OR gates could be used for constructing the SET suppression circuit (200) of FIG. 3. FIG. 7 illustrates two other sub-circuits that are logically equivalent to an AND gate, and FIG. 8 illustrates two other sub-circuits that are logically equivalent to an OR gate. In the sub-circuits of FIGS. 7 and 8, the AND are OR logic sub-circuits are implemented with tri-state buffers in one sub-circuit, and with multiplexers in a different sub-circuit. Other circuit configurations are, of course, possible.

Figure 9:
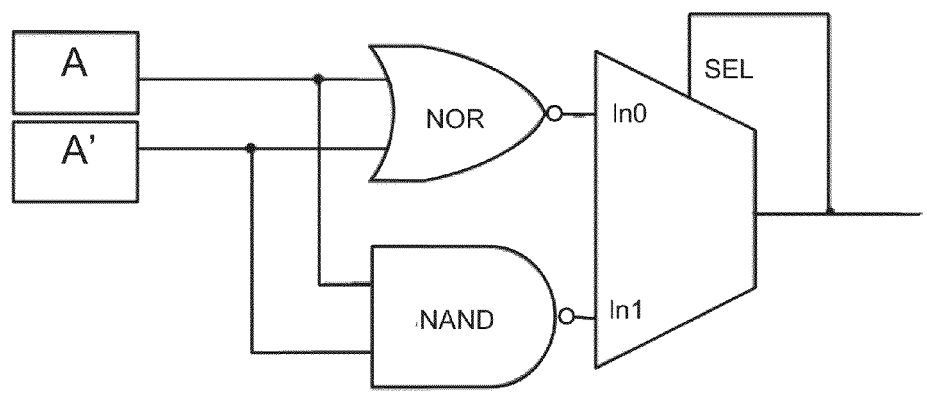
FIG. 9 is similar to FIG. 3 and shows an alternative embodiment which uses NAND and NOR gates instead of AND and OR gates.

FIG. 9 is similar to FIG. 3 but which uses NAND and NOR gates instead of AND and OR gates. Just like FIG. 3, this circuit will suppress an SET that propagates to it. Other logic structures and variations are, of course, possible, although the applicant envisages that the AND-OR or NAND-NOR combinations illustrated in FIGS. 3 and 9 are the simplest means of providing the required insensitive gate combinations required for the SET suppression portion of the circuit structure.

Most SRAM based logic would have to implement the circuit in FIG. 3 and FIG. 5 in SRAM cells just as any other Boolean function would be, which would make the SEU suppression circuit itself equally susceptible to SEUs. However, the Xilinx Virtex FPGA architecture provides tri-state buffers (BUFs) that are actually hard-wired AND-OR logic structures, and therefore the circuits built from these BUFs have a high tolerance to SEUs when compared to circuits implemented using SRAM cells. For the Xilinx FPGAs one would have to use the tri-state buffer architecture of FIGS. 7 and 8 to implement the SEU mitigation circuit. The number of gates required for the SEU suppression circuit is very high when compared to the voter circuits in TMR. However the method can be used on a device which has abundant tri-state buffers which normally go unused, such as on the Xilinx Virtex FPGA. Although the circuit structure of FIG. 3 can be implemented in BUFs in the Xilinx Virtex architecture, it may be specifically added to future volatile FPGAs as part of the hardwired silicon.

The embodiment of the invention illustrated in FIGS. 3 and 5 provides a simple and effective means of suppressing SEUs caused by SETs in both non-volatile and volatile FPGAs respectively, which requires only double modular redundancy (not triple modular redundancy), does not require expensive radiation tolerant circuitry, does not result in any time delay beyond the normal reset time required, uses less circuitry than the applicant's previous methods, but which nevertheless offers immunity against the errors caused by single event upsets. The SET suppression circuit could also be used in space-based applications or in safety-critical terrestrial military or civilian applications.

Extending the SET Suppression Circuit to Mitigate Multiple Bit Upsets Using Triple Modular Redundancy As circuits get smaller and circuit sensitivity increases, it becomes more likely that an SET or glitch will simultaneously occur in two redundant circuits.

When an SET results simultaneously in more than one redundant circuit this is referred to as a Multiple Bit Upset (MBU).

Existing TMR circuits which implement voting circuits are unable to mitigate the effects of MBUs. In the case of bit upsets occurring simultaneously in two of the three identical combinational circuits, the voting circuit will incorrectly vote for the majority.

Figure 10A:
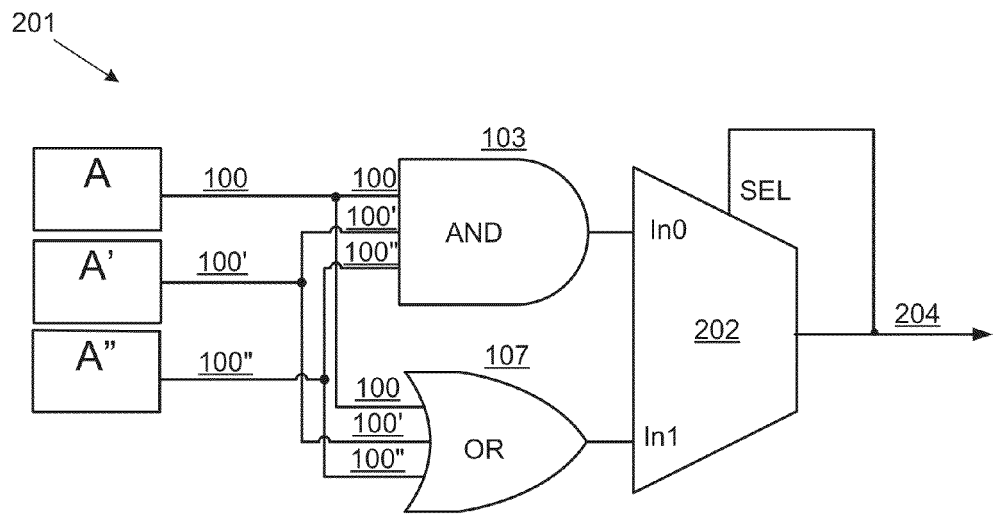
FIG. 10A shows a yet further embodiment of the invention in which multiple bit upsets are mitigated using TMR and the SET suppression circuit.
Figure 10B:
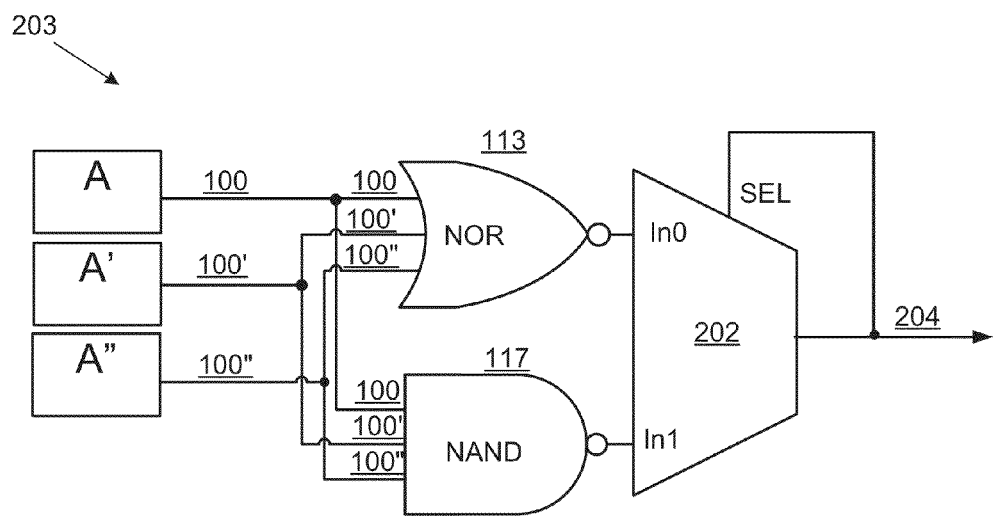
FIG. 10B is similar to FIG. 10A except for that the AND gate and OR gate have been replaced with a NOR gate and a NAND gate respectively.

This problem is addressed in a further embodiment of the invention which is shown in FIG. 10A. In this embodiment, a third identical redundant circuit (A") is provided in addition to (A'). A three input AND gate (103), a three input OR gate (107) as well as a two input MUX (202) are also provided resulting in a SET suppression circuit that can suppress MBUs. The three input AND gate (103) is insensitive to a simultaneous change on two of its inputs when all of the inputs are at logic 0. The three input OR gate (107) is insensitive to a simultaneous change on two of its inputs when all of the inputs are at logic 1. Thus if an SET causes the outputs of two of the three identical combinational circuits (A, A', A") to invert while the outputs (100, 100', 100") are at logic 1, the OR gate (107) will be insensitive to the MBUs. If an SET causes the outputs (100, 100', 100") of two of the three identical combinational circuits (A, A', A") to invert while the outputs (100, 100', 100") are at logic 0, the AND gate (103) will be insensitive to the MBUs. The multiplexer (202) functions in the same way as in the previously mentioned embodiment where the AND gate (103) is selected when the three inputs (100, 100', 100") are at logic 0, and to select the OR gate (107) when the three inputs (100, 100', 100") are at logic 1. This circuit is therefore capable of mitigating the effects of MBUs irrespective of the particular outputs. FIG. 10B shows how the AND and OR gates can be replaced with a NOR gate (113) and NAND gate (117) respectively.

Extending the SET Suppression Circuit to Require No Redundancy but Instead Use a Delay Technique A yet further embodiment of the invention provides an SET suppression circuit that requires no redundancy at all, not even double modular redundancy. Instead of obtaining a redundant output from a redundant circuit, a second, delayed output is obtained by passing the circuit output through a delay element to produce an output which is a delayed replica of the circuit output.

Figure 11A:
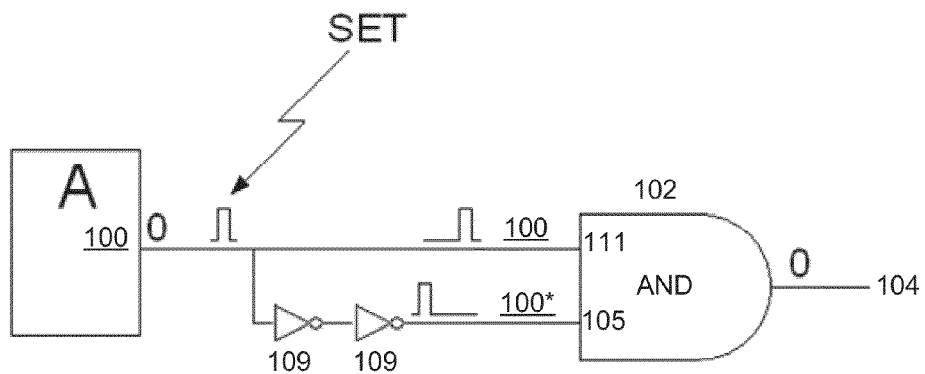
FIG. 11A is a circuit diagram of a portion of an SET suppression circuit which includes an AND gate and is connected to the output of a combinational circuit, where the output of the combinational circuit is at logic 0 before a single event transient (SET) occurs.

FIG. 11A shows a combinational circuit (A) which has an output (100) with a current value of logic 0. The output is branched off and one of the branches passed through two NOT gates (109) connected in series. NOT gates are also termed inverters because they invert a binary signal, so that two NOT gates connected in series produce the identical output to their input but with a timing delay introduced as a result of their inherent circuit element delays. The NOT gates therefore produce a delayed combinational circuit output (100*) in the one branch. The output (100) and the delayed output (100*) are input into an AND gate (102), which has two inputs (105, 111) and a single output (104).

It may happen that a Single Event Transient (SET) occurs in the combinational circuit (A) that propagates to the AND gate. If the current value of the output (100) is logic 0, as illustrated in FIG. 11A, an SET will temporarily cause the output (100) (and hence, the delayed output (100*)) to become logic 1. However, because SETs have an extremely short duration, the SET in the output (100) will arrive at the one input (111) of the AND gate and have dissipated by the time the SET in the delayed output (100*) reaches the other input (105) of the AND gate. The output (104) of the AND gate will remain at logic 0, since "1 AND 0"="0". The output (104) of an AND gate is insensitive to a change in one of its inputs when both inputs are at zero. Hence when the output (100) of the combinational circuit is at logic 0, the output (104) is insensitive to SETs. However, the opposite is true if the combinational circuit output (100) is at logic 1.

Figure 11B:
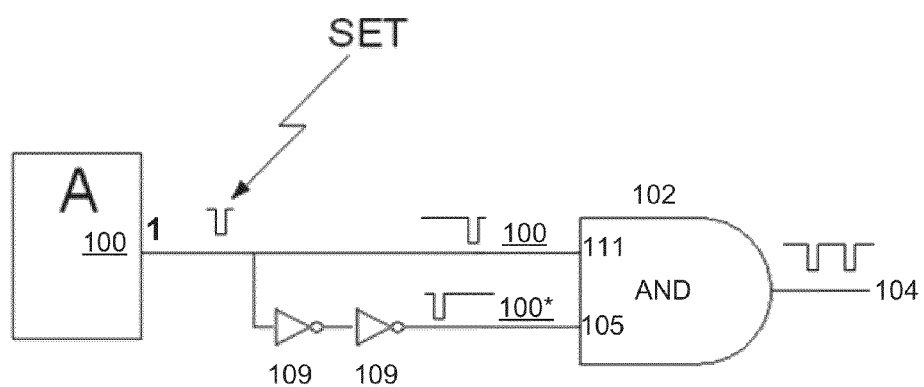
FIG. 11B is a circuit diagram of a portion of an SET suppression circuit which includes an AND gate and is connected to the output of a combinational circuit, where the output of the combinational circuit is at logic 1 before an SET occurs.

Consider FIG. 11B, which is identical to FIG. 11A except that the output (100) is now at logic 1. If an SET occurs as before, the value of the output (100) will briefly transition to logic 0. The SET in the output (100) and the SET in the delayed output (100*) will arrive at the AND gate one after the other but, in this case, the output (104) of the AND gate will incorrectly be inverted to logic 0 because "1 AND 0"="0". Hence the AND gate is sensitive to SETs when the output of the combinational circuit (100) is at logic 1. If this AND gate was the next state logic in a sequential circuit, and the inverted output occurs simultaneously with the active edge of the clock, the SET will be latched, causing an SEU.

Figure 12A:
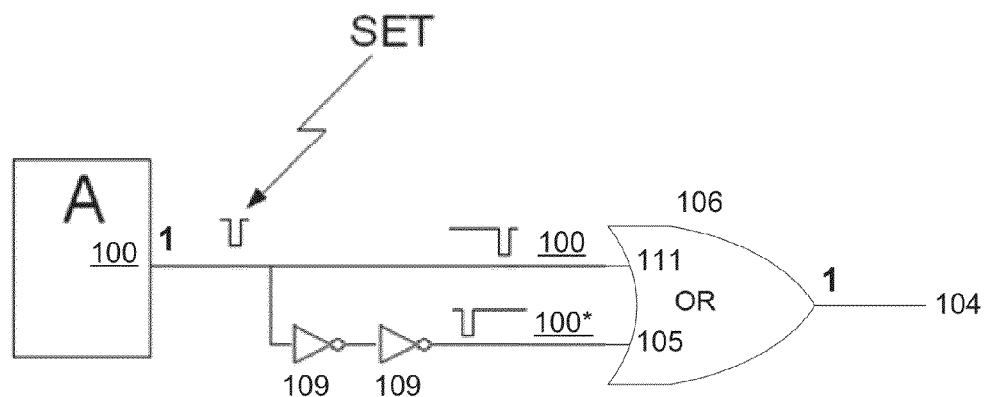
FIG. 12A is a circuit diagram of a portion of an SET suppression circuit which includes an OR gate and is connected to the output of a combinational circuit, where the output of the combinational circuit is at logic 1 before an SET occurs.
Figure 12B:
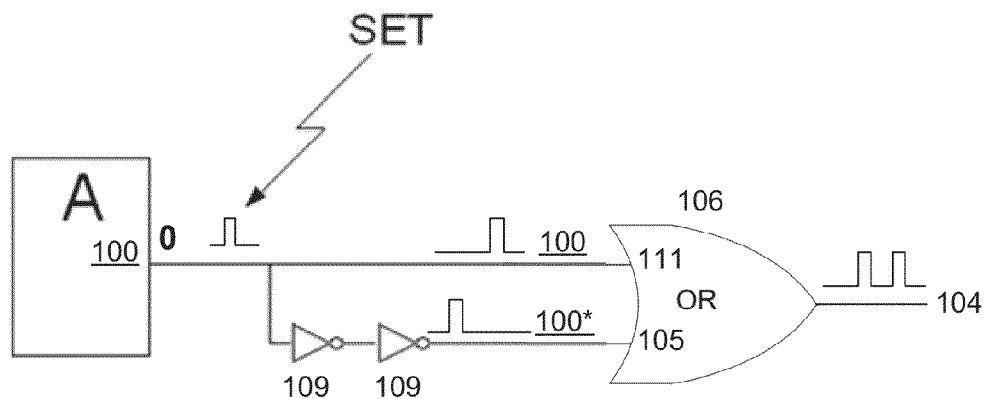
FIG. 12B is a circuit diagram of a portion of an SET suppression circuit which includes an OR gate and is connected to the output of a combinational circuit, where the output of the combinational circuit is at logic 0 before an SET occurs.

Now consider FIG. 12A, which is similar to FIG. 11B except that the AND gate has been replaced with an OR gate (106). With both inputs to the OR gate at logic 1, an SET which results in a temporary bit flip to logic 0 at the output (100) and then subsequently at delayed output (100*) will not cause a change in the output (104), since "1 OR 0"="1". Hence with the combinational circuit output (100) at logic 1, the OR gate is insensitive to SETs. Conversely, consider FIG. 12B, which is identical to FIG. 12A except that the output (100) is now logic 0. With both inputs to the OR gate at logic 0, an SET which results in a temporary bit flip to logic 1 at the output (100) and then subsequently at the delayed output (100*) will cause a change in the output (104). Hence with the combinational output (100) at logic 0, the OR gate is sensitive to SETs. As with FIG. 11B, if the inverted output occurs simultaneously with the active edge of the clock, the SET will be latched, causing an SEU.

Therefore, the AND gate arrangement of FIG. 11A is insensitive to SETs when the combinational circuit output is at logic 0, and the OR arrangement of FIG. 12A is insensitive to SETs when the combinational circuit outputs are at logic 1. Thus, an SET (i.e. a bit flip) which occurs in the combinational circuit during a time in which the output of the combinational circuit is at logic 0 will be dissipated by the circuit arrangement of FIG. 11A, and an SET which occurs during a time in which the output of the combinational circuit is at logic 1 will be dissipated by the circuit arrangement of FIG. 12A.

Figure 13:
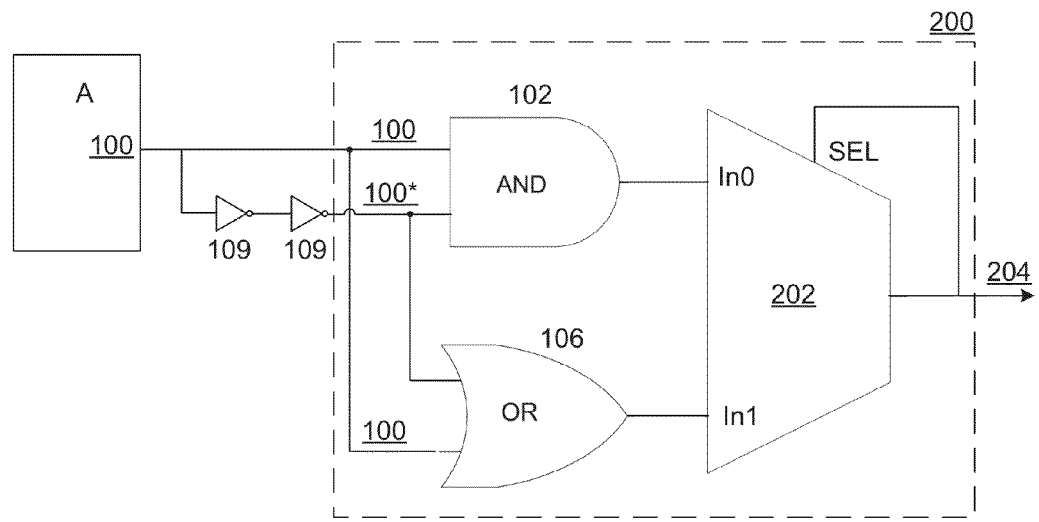
FIG. 13 is a circuit diagram of an SET suppression circuit according an embodiment of the invention.

FIG. 13 is a circuit diagram of an SET suppression circuit (200) capable of mitigating single event upsets caused by single event transients according to the invention, that requires no redundancy but instead uses a delay technique, in which the circuits of FIGS. 11A and 12A have been combined. The circuit of FIG. 13 uses a two-input multiplexer (202) to select the AND gate (102) when the output (100) is at logic 0, and to select the OR gate (106) when the output (100) is at logic 1. This circuit is therefore capable of mitigating the effects of SETs irrespective of the particular outputs at any given time. The operation of the SET suppression circuit (200) will now be explained.

Prior to the combinational circuit (A) being switched on, the output (100) is at logic 0. Both the output of the AND gate and the output of the OR gate will therefore be at logic 0. Since both inputs (In0, In1) to the multiplexer are at logic 0, its output (204) will be logic 0. With the output of the multiplexer connected to its own selection line (SEL), it will select either In0 or In1, depending on the value of the output. In this case, with the output at logic 0, it will select In0, which is connected to the output of the AND gate. After the circuit is switched on, assuming that the output (100) remains at logic 0, an SET which occurs will be suppressed by the AND gate and the output (204) will remain unchanged. The output (204) is connected to a state memory latch element such as a flip flop (not shown).

Assume that, at some time later, the output (100) of the combinational circuit (A) transitions to logic 1. Logic value 1 will become immediately available at one of the inputs to the AND gate and at the other input of the AND gate after the delay period resulting from the two NOT gates. The output of the AND gate will therefore only transition to logic value 1 after the delay period. Since the AND gate output was initially passed through to the multiplexer output (204), the multiplexer output becomes logic 1, and thus its select line (SEL) becomes logic 1, resulting in In1 (the output of the OR gate) now being selected. Should an SET now occur in the output of the combinational circuit (100), the SET will be suppressed by the OR gate and the output (204) will remain unchanged.

The output (204) of the circuit structure (200) of FIG. 13 will therefore always be insensitive to an SET that occurs in the combinational circuit, as long as the duration of the SET is less than the gate delay introduced by the pair of NOT gates. Because the output is insensitive to SETs, no SEUs will occur in the latch element.

Figure 14:
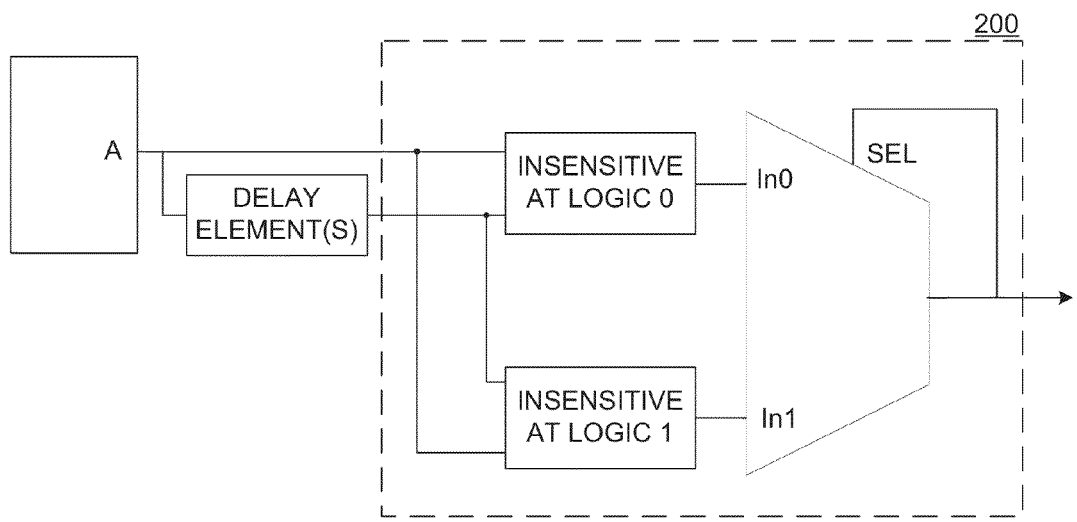
FIG. 14 is a generalized functional illustration of the circuit of FIG. 13.

FIG. 14 is a generalized functional illustration of the circuit of FIG. 13. In FIG. 14, the two NOT gates (109) have been replaced with a logic block termed "DELAY ELEMENT(S)", the AND gate (102) with a logic block termed "INSENSITIVE AT LOGIC 0" and the OR gate (106) with a logic block termed "INSENSITIVE AT LOGIC 1". This illustration demonstrates that the delay elements need not be two NOT gates, the sub-circuit which is insensitive at logic 0 need not be an AND gate and the sub-circuit which is insensitive at logic 1 need not be an OR gate, as previously described. As with the embodiment of FIG. 3, AND and OR gates are not the only gates which are insensitive to changes in one of their inputs at different input logic levels, and the sub-circuits of FIGS. 7 and 8 could be used instead. Delay elements could be made up from virtually any circuit elements which introduce a timing delay.

Figure 15:
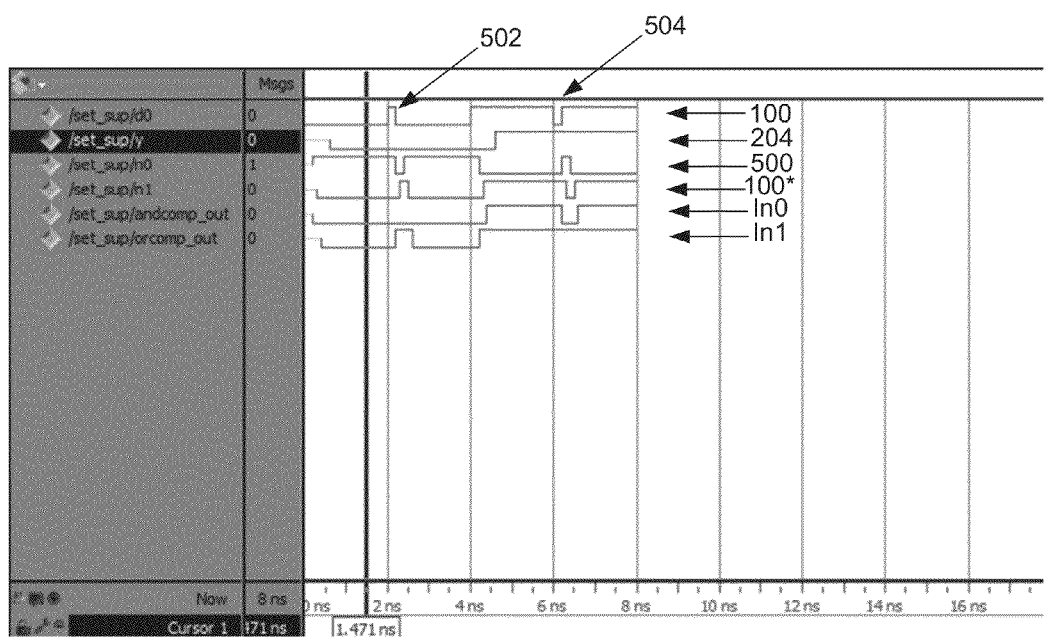
FIG. 15 is a detailed timing simulation of the inputs and output of the SET suppression circuit of FIG. 13 in which simulated single event transients (SETs) have been introduced.

FIG. 15 shows a detailed timing simulation of the suppression circuit (200) of FIG. 13. The timing waveforms shown include the output (100) of the combinational circuit, which forms the input to the SEU suppression circuit, the output (204) of the suppression circuit, a waveform (500) immediately after the first NOT gate (109) and the delayed output (100*) immediately after the second NOT gate (109), the output of the AND gate (In0) which forms the first multiplexer input, and the output of the OR gate (In1) which forms the second multiplexer input. The timing simulation includes all gate delays in the circuits, so as to indicate the actual output which a real world circuit would produce.

At 2 ns, a first SET (502) occurs in the combinational circuit output (100). This SET is suppressed in the output of the AND gate (In0) but not in the output of the OR gate (In1). However, because the current state of the output (204) is logic 0, the multiplexer selects In0 as its input, and so the SET is suppressed by the circuit and the output (204) remains at logic 0.

At 4 ns, the combinational circuit output (100) transitions to logic 1. The output of the OR gate (In1) then transitions to logic 1 and, after the delays resulting from the two NOT gates, the output of the AND gate (In0) also transitions to logic 1. Since In0 (the currently selected input to the multiplexer) is now logic 1, the output of the multiplexer (204) transitions to logic 1 and the multiplexer selects In1 as its input. Later, at 6 ns, a second SET (504) occurs in the combinational circuit output (100). This SET is suppressed in the output of the OR gate (In1) but not in the output of the AND gate (In0). Because the multiplexer has now selected In1 as its input, the SET is suppressed by the circuit and the output (204) remains at logic 1.

The timing diagram therefore shows that the output (204) of the suppression circuit follows the output (100) of the combinational circuit, with a slight timing delay, except where an SET occurs in the combinational circuit output in which case the circuit suppresses the SET. The circuit is able to suppress any number of consecutive SETs, with only a small amount of additional circuitry, namely an AND gate, and OR gate, two NOT gates and a two-input multiplexer.

The SEU suppression circuit of FIG. 13 could be used in Application Specific Integrated Circuits (ASICs) or in Flash and Antifuse based FPGAs that have configuration memories that are insensitive to SETs, where any SET present in the user logic will be temporary. Therefore, the circuit structure of FIG. 13 is suitable for suppressing SEUs caused by SETs indefinitely in these hardware devices. Note that for volatile FPGAs, this embodiment will not be suitable as double modular redundancy will be required, as illustrated in FIG. 5, to enable the circuit that experienced the error to be disconnected.

The circuit of FIG. 13 could also be used for removing glitches in digital circuits, whether or not those digital circuits are combinational circuits. The circuit of FIG. 13 could simply be interposed between an output of the digital circuit and a final output, and would be effective in suppressing any glitches (i.e. temporary transients) which are of shorter duration than the delay resulting from the circuit delay elements.

It will be appreciated that while FIG. 13 illustrates a combinational circuit (A) with only one output (100), the circuit could be repeated for each pair of corresponding outputs in the case of a combinational circuit with multiple outputs.

Figure 16:
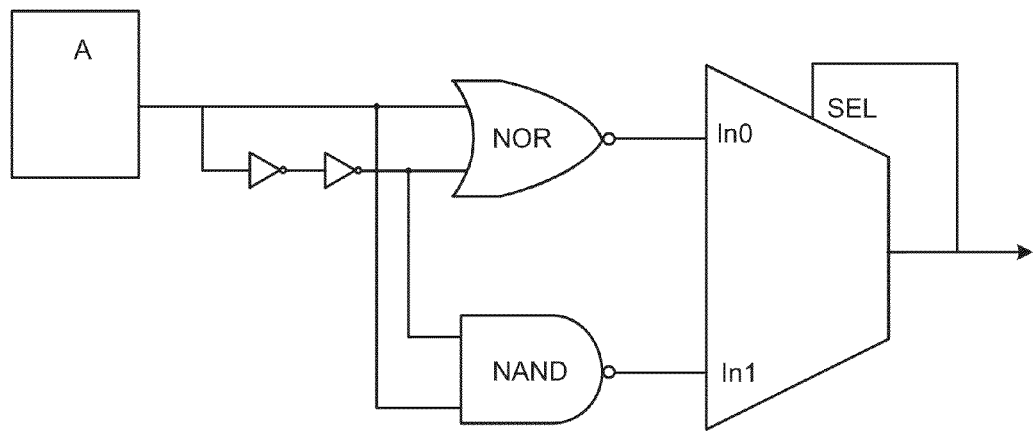
FIG. 16 is similar to FIG. 13 and shows an alternative embodiment which uses NAND and NOR gates instead of AND and OR gates.

FIG. 16 is similar to FIG. 13 and shows an alternative embodiment which uses NAND and NOR gates instead of AND and OR gates. Just like FIG. 13, this circuit will suppress any SETs that propagate to the circuit. Other logic structures and variations are, of course, possible, although the applicant envisages that the AND-OR or NAND-NOR combinations illustrated in FIGS. 13 and 16 are the simplest means of providing the required insensitive gate combinations.

Experimental Results for the SET Suppression Circuit that Uses the Delay Technique The SET suppression circuit and method of FIG. 13 was tested on the combinational circuits of the MCNC'91 benchmark suite. The netlists which were in EDIF (Electronic Design Interchange Format) were converted into structural VHDL (Very high speed integrated circuit Hardware Description Language) format. This ensured that the generated VHDL file could be fed into the manufacturer design software to accurately map the designs onto the relevant FPGAs.

Figure 17:
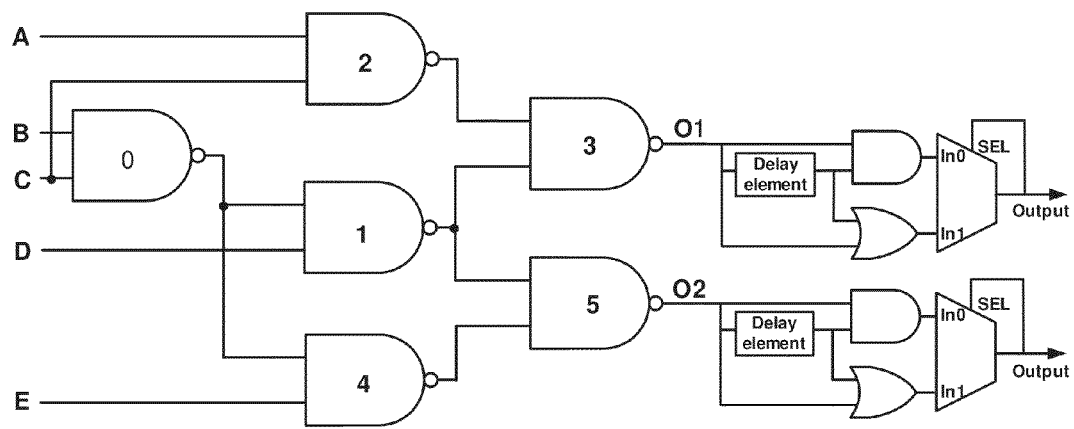
FIG. 17 is a circuit diagram of a MCNC'91 benchmark circuit that has been modified to include SEU suppression circuits of the invention.

An algorithm for adding the SET suppressor of FIG. 13 to the primary outputs was then coded in the "C" programming language. The created application code was used to convert the generated VHDL netlist (from MVSIS) to the functional equivalent structural VHDL code of the SET Suppressor circuit added to the primary outputs. This is illustrated by considering FIG. 17, which shows the structural VHDL netlist of the MCNC'91 benchmark circuit, C17, which is modified with the application code by adding the SET suppressor of FIG. 13 to each primary output, Q1 and Q2. The aim of the experiment was to validate the operation of the SET suppres sor at the primary outputs of the benchmark circuits. The SET suppressor should mitigate the effects of SETs reaching the outputs of the combinational circuits.

Figure 18:
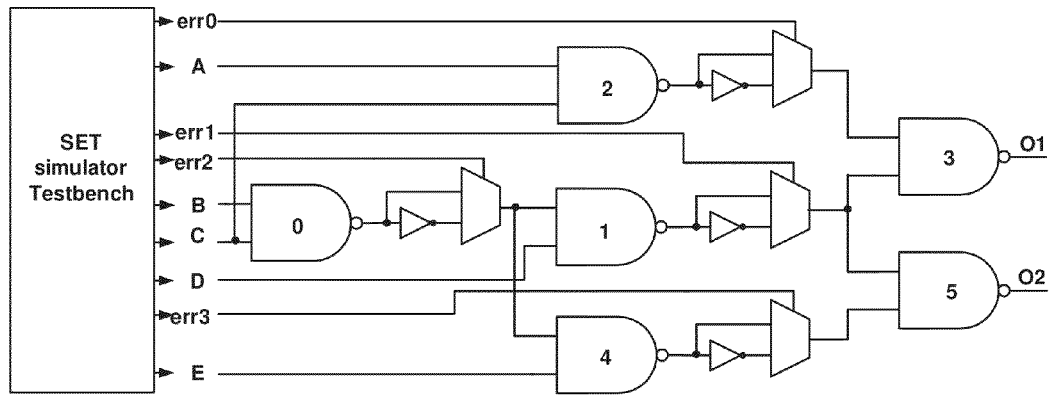
FIG. 18 is a circuit diagram the experimental setup in which the SET errors are inserted in a test circuit by means of a VHDL simulator.

An SET simulator test bench was designed in VHDL to inject faults into the circuits for testing. To achieve this aim, the VHDL simulator outputs were connected to every internal signal of the combinational circuit. The signal lines are driven by two sources, the original input and the simulator output. A VHDL resolution function was therefore created to resolve the two signals driving one output. The resolution functions are synthesized into a multiplexer and NOT gate configuration as indicated in FIG. 18. A logic 1 on any of the error signal lines (err0 to err4) results in the internal signal value being inverted, hence simulating an SET.

FIG. 18 also shows an example of the experimental setup in which the SET errors are inserted in a test circuit (in this case the original C17 circuit) by means of a VHDL simulator. The simulator temporarily inverts the value on a line emulating an SET. Fault simulation was performed on the original and hardened circuits using the VHDL simulator ModelSim.

In order to facilitate comparison, the original circuit, a Triple Modular Redundancy (TMR) circuit, and the proposed SET Suppressor circuit were tested side-by-side. The benchmark circuits were tested using a 1000 input vector sequence. The sequence was randomly generated with each input vector duration being equal to 20 ns. The original circuit, proposed SET Suppressor method as well as the TMR hardened circuits were tested with the same set of test vectors. The SET can occur randomly on any line of the circuit and introduces a fault on a line at a random time. The simulator subjects the circuit to this condition by randomly injecting a fault on any one signal. An SET can occur during the input transitions or at any instance during the application of inputs.

The benchmarks were tested using 1000 SETs, one per test vector. The input test vector sequence was randomly generated with each vector duration equal to 20 ns. Based on the empirical data of $10^{-5}$ bit-upsets/day typical for space-based applications, which can be approximated to one SEU per day in the circuit, it is equivalent to simulating the circuit in an actual radiation environment for a period of 1,000 days. Furthermore, the duration of an SET upsetting the device is less than 200 ps. The delay element was implemented with two inverters connected in series with a delay time of more than 200 ps.

Figure 19:
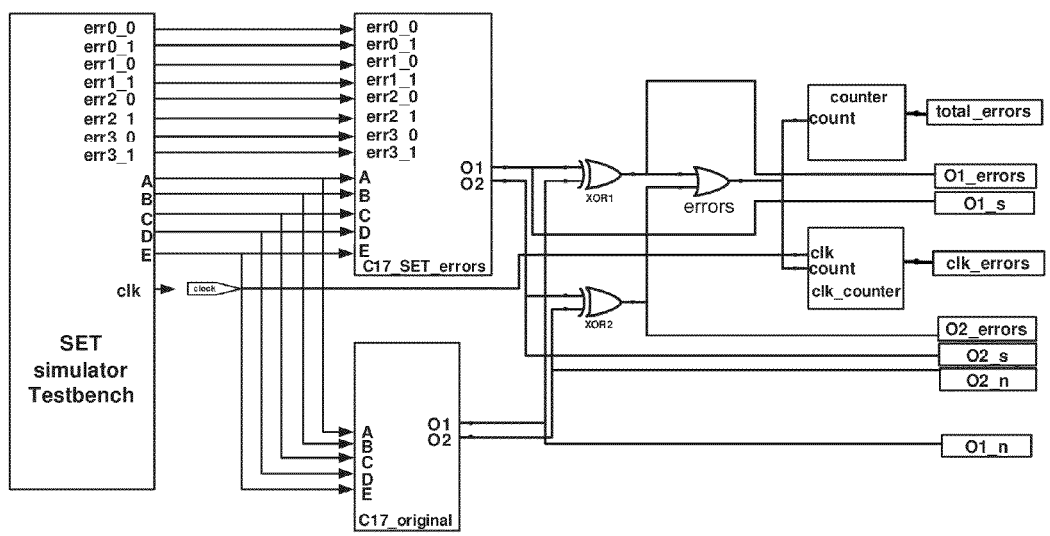
FIG. 19 is a circuit diagram illustrating the setup for fault insertion, testing and error calculation.

To illustrate the operation of the SET Suppressor, it was applied to the MCNC'91 benchmark C17 circuit. FIG. 19 shows the process of fault insertion, testing and errors calculation. The C17 SET Suppressor hardened circuit is faulted by introducing SETs using the simulator test-bench and simulated. The functional operation of the hardened C17 circuit (C17_SET_SUP_errors) is compared against that of the original circuit without errors (C17_original). This is done by XOR-ing the corresponding outputs of both the circuits.

A difference between these outputs indicates that the SET induced in the hardened circuit has propagated to its output(s), thus leading to a functional failure. The total number of errors reaching any of the outputs is OR-ed and added with the counter, and indicated as "total_errors". This way, all errors from the outputs are calculated. The total numbers of errors are also added with another counter that is synchronized to a clock. Hence, the clk_counter only counts errors that are available at the active edge of its clock.

Table 1 below shows the test results for the MCNC'91 benchmarks:

TABLE 1

Comparative Test Results for Original Circuit, a TMR circuit and the SET Suppressor Circuit using the Delay Technique

| | Original Circuits | | | TMR Circuits | | |
|---|---|---|---|---|---|---|
| Benchmark | Total Errors | Clk Errors | Area (no of gates) | Total Errors | Area (no of gates) | Area increase w.r.t original |
| b9 | 294 | 13 | 101 | 0 | 359 | 3.55 |
| c17 | 612 | 34 | 6 | 0 | 26 | 4.33 |
| cc | 701 | 34 | 44 | 0 | 184 | 4.18 |
| cht | 802 | 47 | 133 | 0 | 543 | 4.08 |
| cm138a | 546 | 25 | 16 | 0 | 80 | 5.00 |
| cm151a | 249 | 10 | 27 | 0 | 85 | 3.15 |
| cm152a | 337 | 17 | 24 | 0 | 76 | 3.17 |
| cm163a | 301 | 14 | 27 | 0 | 101 | 3.74 |
| cmb | 681 | 28 | 32 | 0 | 160 | 5.00 |
| comp | 114 | 5 | 91 | 0 | 277 | 3.04 |
| cordic | 105 | 5 | 35 | 0 | 109 | 3.11 |
| count | 289 | 13 | 99 | 0 | 361 | 3.65 |
| frg1 | 113 | 6 | 100 | 0 | 312 | 3.12 |
| mux | 252 | 7 | 38 | 0 | 126 | 3.32 |
| my_adder | 702 | 36 | 163 | 0 | 553 | 3.39 |
| parity | 991 | 47 | 15 | 0 | 49 | 3.27 |
| pcle | 425 | 20 | 59 | 0 | 213 | 3.61 |
| pm1 | 333 | 25 | 35 | 0 | 133 | 3.80 |
| sct | 366 | 25 | 58 | 0 | 194 | 3.34 |
| tcon | 797 | 33 | 25 | 0 | 107 | 4.28 |
| ttt2 | 415 | 20 | 166 | 0 | 566 | 3.41 |
| unreg | 625 | 33 | 87 | 0 | 325 | 3.74 |

| | SET_SUP Circuits | | | | |
|---|---|---|---|---|---|
| Benchmark | Errors | Clk Errors | Area (no of gates) | Area increase w.r.t original | Savings w.r.t TMR |
| b9 | 3 | 0 | 143 | 1.42 | 60% |
| c17 | 18 | 0 | 12 | 2.00 | 54% |
| cc | 10 | 0 | 83 | 1.89 | 55% |
| cht | 19 | 0 | 241 | 1.81 | 56% |
| cm138a | 8 | 0 | 40 | 2.50 | 50% |
| cm151a | 7 | 0 | 30 | 1.11 | 65% |
| cm152a | 12 | 0 | 27 | 1.13 | 64% |
| cm163a | 12 | 0 | 42 | 1.56 | 58% |
| cmb | 10 | 0 | 80 | 2.50 | 50% |
| comp | 2 | 0 | 91 | 1.00 | 67% |
| cordic | 1 | 0 | 38 | 1.09 | 65% |
| count | 11 | 0 | 147 | 1.48 | 59% |
| frg1 | 1 | 0 | 109 | 1.09 | 65% |
| mux | 8 | 0 | 47 | 1.24 | 63% |
| my_adder | 20 | 0 | 211 | 1.29 | 62% |
| parity | 33 | 0 | 18 | 1.20 | 63% |
| pcle | 9 | 0 | 86 | 1.46 | 60% |
| pm1 | 10 | 0 | 56 | 1.60 | 58% |
| sct | 10 | 0 | 73 | 1.26 | 62% |
| tcon | 23 | 0 | 49 | 1.96 | 54% |
| ttt2 | 12 | 0 | 217 | 1.31 | 62% |
| unreg | 18 | 0 | 135 | 1.55 | 58% |

The columns corresponding to "Original Circuits" represent the statistics of the original circuits, the columns below "TMR Circuits" show the results of the TMR circuits and the columns below "SET_SUP Circuits" show the results of the SET suppression circuit of the invention. Table 1 also shows the area savings of the SET suppressor circuit over the TMR design of the same circuit, as well as the area increase of the SET_SUP and TMR circuits with respect to the original. These results include the overhead of the hardened circuit as far as the SET Suppressor circuit is concerned, and the TMR circuit as far as the majority voter is concerned.

Figure 20:
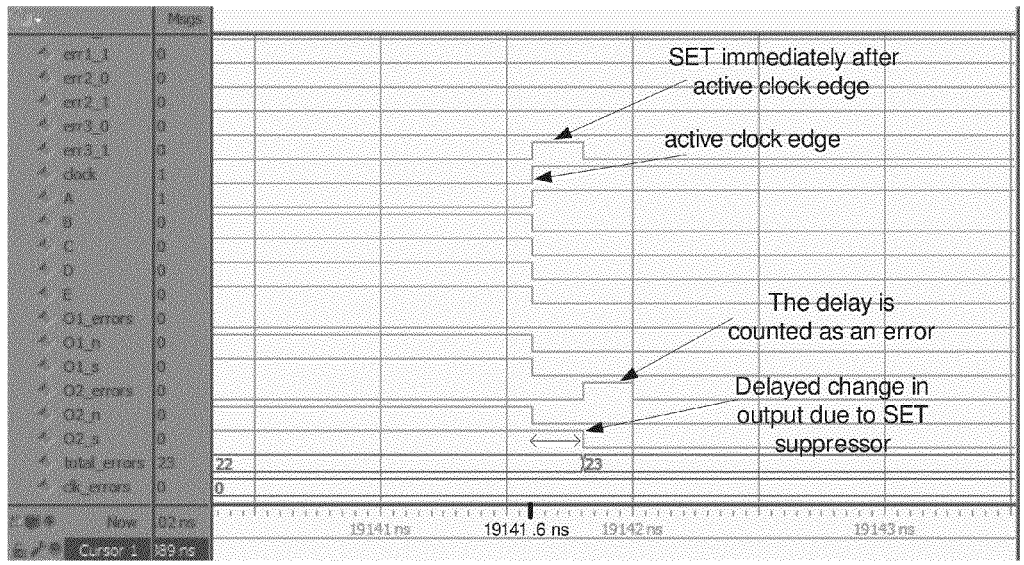
FIG. 20 is a timing simulation of various outputs of FIG. 19 illustrating that the "errors" detected in the circuit of the invention are always during signal transitions and are therefore not errors in the SET suppressor output.

The SET suppressor circuits of this embodiment of the invention show a 54-67% area improvement over the TMR implementations. The total errors of the SET suppressor circuits show SETs that propagate to the outputs between 1 and 33. However, on closer inspection of these "errors", it becomes evident that it only occurs during primary input signal transitions. This can be seen in FIG. 20, which is a zoomed in portion of the C17 timing simulation. In the event that a SET occurs immediately as the values of the primary outputs of the benchmark circuits are about to change; as indicated in FIG. 20 at time 19141.6 ns; the output of the SET suppression circuit will be delayed by the SET length. This does not manifest itself as a bit-flip at the SET Suppressor output as far as the SET Suppressor circuit is concerned, but rather a delay equal to the SET length, as can be seen by looking at O2_s in FIG. 20. However, since the functional operation of the hardened C17 circuit (C17_SUP_errors) is compared with that of the original circuit without errors (C17_original), the delay in the hardened circuit compared to the original is seen by the XOR gate as a difference. The difference is counted by the counter in FIG. 19 and is an indication of the number of times this condition happens for the tested MCNC'91 benchmark circuits that were tested.

Therefore there are no errors, and no glitches appear in the SET Suppressor outputs. Further, a combinational circuit is almost never used alone in an FPGA, and is normally part of a sequential circuit. As indicated in Table 1, no errors were observed for any of the SET Suppressor hardened circuits at the active edge of the clock. This is consistent with the operation of the SET suppressor, as the SET can only affect its output with a delay during input signal transitions, i.e. immediately after the active clock edge. As with TMR, the SET Suppressor circuit provides total immunity against SETs, however it does so with an area savings of 54-67% with respect to TMR. Hence, the proposed SET suppressor method is a powerful SET mitigation technique for combinational circuits. The proposed method is provided as technology independent, and as long as the configuration memory is not sensitive to SEUs, the proposed method could be applied.

Figure 21:
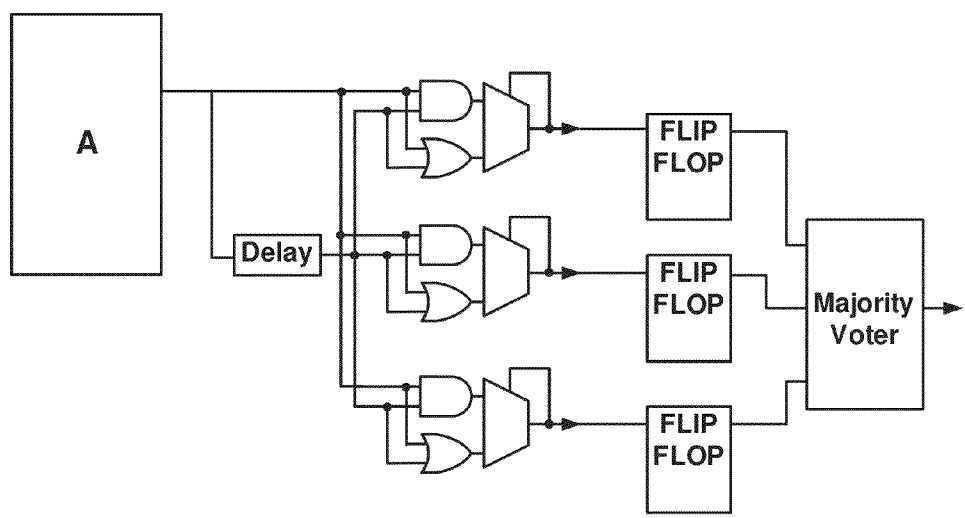
FIG. 21 is a circuit diagram showing a method of hardening the SET suppressor of the invention itself against SETs that may occur within its circuitry.

A direct SET strike to the SET suppression circuit of FIG. 13 at In0 (when the inputs are at logic 0) or In1 (when the inputs are at logic 1) will propagate to the output. Hence, because of the sensitivity of the SET suppression circuit itself to SETs, and to avoid any SET single point failure, the SET suppressor of FIG. 13 could be tripled and each output connected to a separate flip flop. The three flip flop outputs are then input to a majority voter. This is illustrated in FIG. 21. Note that it is only the SET suppression circuit that is tripled, so that it is not an instance of TMR where the combinational circuit itself is tripled. The circuit of FIG. 21 will be insensitive to SETs that occur both in the combinational logic (A) and the SET suppression circuit itself.

The invention claimed is:

1. A circuit structure for suppressing single event transients (SETs) or glitches in digital electronic circuits, comprising:
   a first input which receives an output of a digital electronic circuit;
   a second input which receives a redundant or duplicated output of the digital electronic circuit;
   two sub-circuits that each receive the first and second inputs and each have one output;
   wherein the output of one of the sub-circuits is insensitive to a change in the value of one of the inputs when the inputs are in a first logic state, and wherein the output of the other of the sub-circuits is insensitive to a change in the value of one of the inputs when the inputs are in a second, inverted logic state;
   a two-input multiplexer which receives the outputs of the two sub-circuits as the multiplexer's inputs and selects one of the multiplexer's inputs as its output;
   wherein the selected multiplexer input is determined by the logic value of the output of the multiplexer and the two sub-circuits are arranged so that the output of the sub-circuit which is insensitive to a change in the value of one of the inputs is selected whenever the output of the multiplexer changes;
   so that the output of the multiplexer is always insensitive to an SET or glitch in the digital electronic circuit that may result in a temporary change in the logic value of either the first input or the second input;
   the output of the multiplexer being provided as a final output of the digital electronic circuit in which SETs and glitches have been suppressed.

2. A circuit structure as claimed in claim 1 in which one sub-circuit is an "AND" or a "NOR" gate which is insensitive to a change in the value of one of its inputs when both inputs are at logic 0, and the other sub-circuit is an "OR" or a "NAND" gate which is insensitive to a change in the value of one of its inputs when both inputs are at logic 1.

3. A circuit structure as claimed in claim 1 in which the output of the multiplexer is connected to a selection port of the multiplexer so that the selected multiplexer input is determined by whether the output of the multiplexer is at logic 0 or logic 1.

4. A circuit structure as claimed in claim 1 in which the redundant or duplicated output of the digital electronic circuit is a delayed duplicated circuit output provided by passing the digital circuit output through a delay element.

5. A circuit structure as claimed in claim 4 in which the delay element includes one or more circuit elements which introduce a timing delay without inverting the digital electronic circuit output, the output of the multiplexer thereby being insensitive to an SET or glitch that may temporarily change the logic value of the either the circuit output or the delayed duplicated circuit output for a time period that is shorter than the timing delay introduced by the delay element.

6. A circuit structure as claimed in claim 1 in which the redundant or duplicated output is a redundant output provided by a second identical redundant electronic circuit.

7. A circuit structure as claimed in claim 6 in which the circuit structure includes a sensing circuit which compares the output of the digital electronic circuit to the output of the multiplexer and compares the redundant output to the output of the multiplexer so as to determine in which of the two circuits an SET or glitch has occurred and, upon detection of an SET or glitch, disconnects the digital electronic circuit in which the SET or glitch occurred from the two sub-circuits, so that the output of the multiplexer follows only the input connected to the electronic circuit which did not experience an SET or glitch, until a power reset or memory reconfiguration has occurred.

8. A circuit structure as claimed in claim 6 in which the circuit structure includes a third input which receives a redundant output provided by a third identical redundant electronic circuit, wherein the two sub-circuits each receive all three inputs, and wherein the output of one of the sub-circuits is insensitive to a simultaneous change in the value of two of the three inputs when the three inputs are in a first logic state, and wherein the output of the other of the sub-circuits is insensitive to a simultaneous change in the value of two of the three inputs when the three inputs are in a second, inverted logic state, the output of the multiplexer thereby being insensitive to Multiple Bit Upsets (MBUs) that may be caused by simultaneous SETs or glitches in two of the three digital electronic circuits.

9. A circuit structure as claimed in claim 1 in which the digital electronic circuit is a combinational electronic circuit that includes next-state logic, wherein the final output is to be latched into a state memory latch element, and wherein the combinational electronic circuit is part of a sequential circuit selected from the group consisting of non-volatile Field Programmable Gate Arrays (FPGAs) or Application Specific Integrated Circuits (ASICs).

10. A circuit structure as claimed in claim 1 in which the digital electronic circuit is a combinational electronic circuit that includes next-state logic, wherein the final output is to be latched into a state memory latch element, and wherein the combinational electronic circuit is part of a sequential circuit that is a volatile Field Programmable Gate Array (FPGA).

11. A circuit structure as claimed in claim 1 in which the output of the multiplexer is connected to a state memory latch element, and for the entire suppression circuit structure and state memory latch element to be triplicated and the output of each of the three state memory latch elements to be input into a majority voter which always selects as its output the value of the majority of its inputs, the circuit structure thereby being hardened against SETs or glitches that may occur in the suppression circuit structure itself.

12. A method of suppressing single event transients (SETs) or glitches in digital electronic circuits, comprising:
    taking an output of a digital electronic circuit as a first input;
    taking a redundant or duplicated output of the digital electronic circuit as a second input;
    inputting the first and second inputs into two sub-circuits that each receive the first and second inputs and each have one output;
    wherein the output of one of the sub-circuits is insensitive to a change in the value of one of the inputs when the inputs are in a first logic state, and wherein the output of the other of the sub-circuits is insensitive to a change in the value of one of the inputs when the inputs are in a second, inverted logic state;
    inputting the two sub-circuit outputs into a two-input multiplexer which receives the outputs of the two sub-circuits and selects one of the multiplexer's inputs as its output;
    wherein the selected multiplexer input is determined by the logic value of the output of the multiplexer and the two sub-circuits are arranged so that the output of the sub-circuit which is insensitive to a change in the value of one of the inputs is selected whenever the output of the multiplexer changes;
    so that the output of the multiplexer is always insensitive to an SET or glitch in the digital electronic circuit that may result in a temporary change in the logic value of either the first input or the second input; and
    providing the output of the multiplexer as a final output of the digital electronic circuit in which SETs and glitches have been suppressed.

13. A circuit structure for suppressing single event transients (SETs) or glitches in digital electronic circuits, comprising:
    a first input which receives an output of a digital electronic circuit;
    a second input which receives a redundant output provided by a second identical redundant electronic circuit;
    an SET/glitch suppression sub-circuit which is capable of suppressing glitches or SETs that result in a temporary change in the logic value of either the first input or the second input and which provides an output in which SETs and glitches have been suppressed; and
    a sensing circuit which compares the output of the digital electronic circuit to the output of the SET/glitch suppression sub-circuit and compares the redundant output to the output of the SET/glitch suppression sub-circuit so as to determine in which of the two digital electronic circuits an SET or glitch has occurred and, upon detection of an SET or glitch, disconnects the input connected to the electronic circuit in which the SET or glitch occurred from the two sub-circuits, so that the output of the SET/glitch suppression sub-circuit follows only the input connected to the electronic circuit which did not experience an SET or glitch, until a power reset or memory reconfiguration has occurred.

14. A circuit structure as claimed in claim 13 in which the sensing circuit includes a pair of XOR gates which compares the output of the digital electronic circuit to the output of the SET/glitch suppression sub-circuit and compares the redundant output to the output of the SET/glitch suppression sub-circuit to determine in which of the two digital electronic circuits an SET or glitch has occurred, and in which a pair of multiplexers are interposed between the digital electronic circuit outputs and the first and second inputs and arranged so that, when an SET or glitch is detected by the sensing circuit, the output of the digital electronic circuit in which the SET or glitch was detected is disconnected from the SET/glitch suppression sub-circuit until a power reset or memory reconfiguration has occurred.

* * * * *